(12) United States Patent
Park et al.

(10) Patent No.: US 9,947,684 B2
(45) Date of Patent: Apr. 17, 2018

(54) THREE-DIMENSIONAL SEMICONDUCTOR DEVICE

(71) Applicants: Joyoung Park, Seoul (KR); Yong-Hyun Kwon, Hwaseong-si (KR); Jeongsoo Kim, Seoul (KR); Seok-Won Lee, Yongin-si (KR); Jinwoo Park, Gunpo-si (KR); Oik Kwon, Yongin-si (KR); Seungpil Chung, Seoul (KR)

(72) Inventors: Joyoung Park, Seoul (KR); Yong-Hyun Kwon, Hwaseong-si (KR); Jeongsoo Kim, Seoul (KR); Seok-Won Lee, Yongin-si (KR); Jinwoo Park, Gunpo-si (KR); Oik Kwon, Yongin-si (KR); Seungpil Chung, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 12 days.

(21) Appl. No.: 15/241,781

(22) Filed: Aug. 19, 2016

(65) Prior Publication Data
US 2017/0179149 A1 Jun. 22, 2017

(30) Foreign Application Priority Data
Dec. 17, 2015 (KR) .................. 10-2015-0181140

(51) Int. Cl.
*H01L 27/11* (2006.01)
*H01L 27/11582* (2017.01)
*H01L 27/11568* (2017.01)

(52) U.S. Cl.
CPC .. *H01L 27/11582* (2013.01); *H01L 27/11568* (2013.01)

(58) Field of Classification Search
CPC .......... H01L 27/11582; H01L 27/1157; H01L 27/11556; H01L 27/11565; H01L 27/11524; H01L 27/11575; H01L 27/11573; H01L 27/0688; H01L 27/11578;
(Continued)

(56) References Cited

U.S. PATENT DOCUMENTS 8,426,908 B2 4/2013 Higashi
8,455,940 B2 6/2013 Lee et al.
8,541,831 B2 9/2013 Chae et al.
(Continued)

FOREIGN PATENT DOCUMENTS

JP 5804662 9/2015

*Primary Examiner* — Julio J Maldonado
*Assistant Examiner* — Rodolfo D Fortich
(74) *Attorney, Agent, or Firm* — F. Chau & Associates, LLC

(57) ABSTRACT

A semiconductor device includes a substrate including a cell region and a connection region. A stack is disposed on the substrate. A vertical channel structure penetrates the stack in the cell region. The stack includes electrode patterns and insulating patterns which are alternatingly and repeatedly stacked on the substrate. Each of the electrode patterns may extend in a first direction and include a pad portion. The pad portion is positioned in the connection region. The pad portion includes a first sidewall and a second sidewall that extend in the first direction on opposite sides of the pad portion. The first sidewall has a recessed portion that is recessed in a second direction crossing the first direction toward the second sidewall.

17 Claims, 20 Drawing Sheets

(58) Field of Classification Search
CPC ............. H01L 27/115; H01L 27/11519; H01L 27/11551
USPC .................... 257/329, 314, 296, 324, 300
See application file for complete search history.

(56) References Cited

U.S. PATENT DOCUMENTS

| | | |
|---|---|---|
| 8,664,101 B2 | 3/2014 | Kim et al. |
| 8,735,860 B2 | 5/2014 | Park et al. |
| 9,165,611 B2 | 10/2015 | Yun et al. |
| 2012/0208347 A1 | 8/2012 | Hwang et al. |
| 2014/0191389 A1* | 7/2014 | Lee .................... H01L 21/7685 257/734 |
| 2014/0197546 A1 | 7/2014 | Hwang et al. |
| 2014/0264549 A1 | 9/2014 | Lee |

* cited by examiner

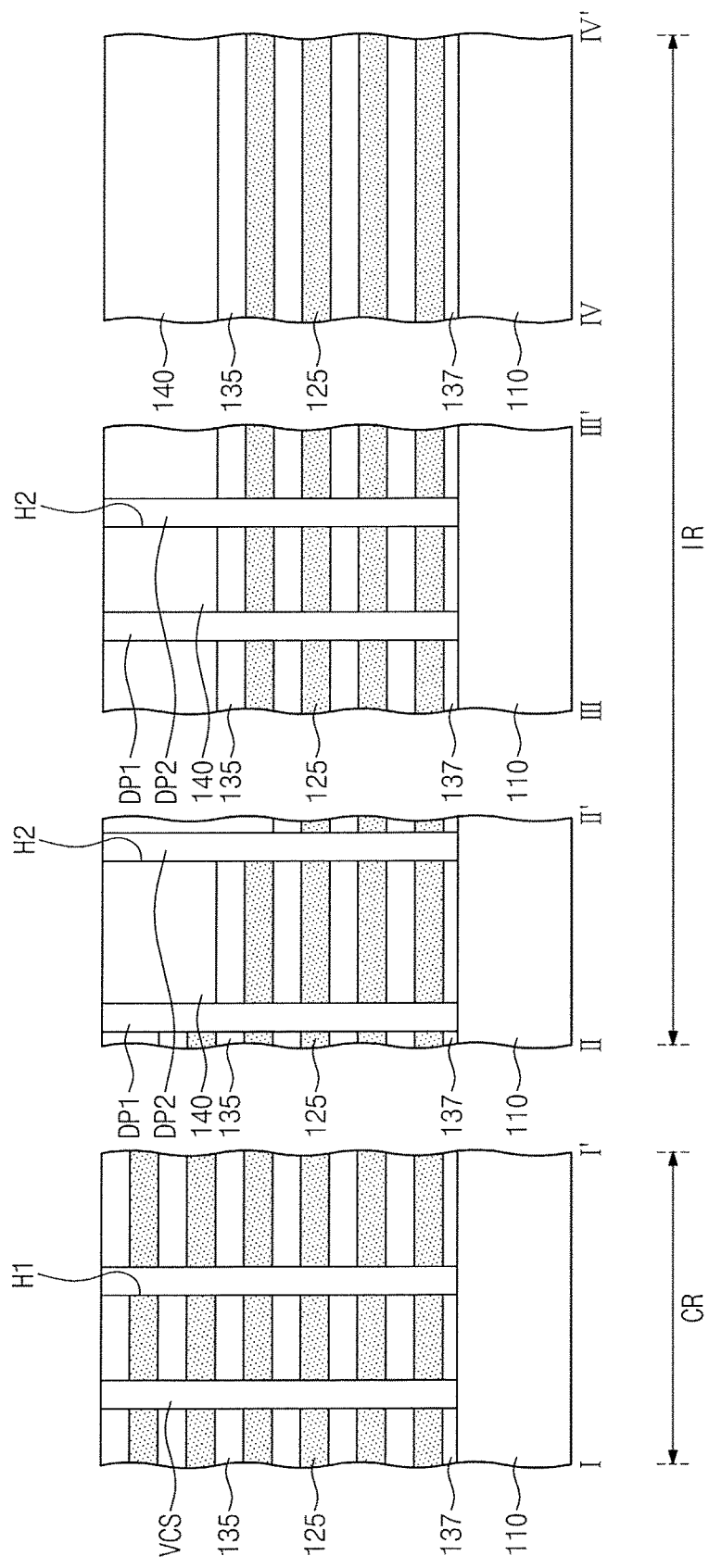

THREE-DIMENSIONAL SEMICONDUCTOR DEVICE

CROSS-REFERENCE TO RELATED APPLICATION

This U.S. non-provisional patent application claims priority under 35 U.S.C. § 119 to Korean Patent Application No. 10-2015-0181140, filed on Dec. 17, 2015, in the Korean Intellectual Property Office, the disclosure of which is incorporated by reference herein in its entirety.

TECHNICAL FIELD

Exemplary embodiments of the present inventive concept relate to a semiconductor device, and more particularly to a three-dimensional semiconductor device.

DISCUSSION OF RELATED ART

Higher integration of semiconductor devices may increase performance and reduce prices for semiconductor devices. In the case of two-dimensional or planar semiconductor memory devices, integration may be determined by the area occupied by a unit memory cell, and by the level of a fine pattern forming technology.

Three-dimensional semiconductor memory devices may have three-dimensionally arranged memory cells, which may include relatively fine patterns.

SUMMARY

Exemplary embodiments of the present inventive concept provide a highly reliable semiconductor device.

Exemplary embodiments of the present inventive concept provide a method of fabricating a highly reliable semiconductor device.

According to some exemplary embodiments of the present inventive concept, a semiconductor device includes a substrate including a cell region and a connection region. A stack is disposed on the substrate. A vertical channel structure penetrates the stack in the cell region. The stack includes electrode patterns and insulating patterns which are alternatingly and repeatedly stacked on the substrate. Each of the electrode patterns may extend in a first direction and include a pad portion. The pad portion is positioned in the connection region. The pad portion includes a first sidewall and a second sidewall that extend in the first direction on opposite sides of the pad portion. The first sidewall has a recessed portion that is recessed in a second direction crossing the first direction toward the second sidewall.

According to some exemplary embodiments of the present inventive concept, a semiconductor device includes a substrate including a cell region and a connection region. A stack is disposed on the substrate and extends in a first direction. A vertical channel structure penetrates the stack in the cell region. The stack includes electrode patterns and insulating patterns which are alternatingly and repeatedly stacked on the substrate. The stack has a staircase structure in the connection region. The staircase structure includes a sidewall extending in the first direction. The sidewall includes non-recessed portions and recessed portions. The recessed portions are laterally recessed toward the stack. Each of the recessed portions extends in a direction perpendicular to the first direction.

According to some exemplary embodiments of the present inventive concept, a semiconductor device includes a substrate comprising a cell region and a connection region, a stack vertically extending from the substrate, wherein the stack comprises a plurality of electrode patterns and a plurality of insulating patterns alternatingly and repeatedly stacked on the substrate, and a plurality of dummy pillars penetrating the plurality of electrode patterns and the plurality of insulating patterns in the connection region. Each of the plurality of electrode patterns comprises a pad portion in the connection region. The pad portion comprises a first portion comprising a non-recessed portion along a sidewall of the pad portion and a second portion comprising a recessed portion along the sidewall of the pad portion. The dummy pillars are aligned with the non-recessed portion of the pad portion along a direction perpendicular to the sidewall of the pad portion when the dummy pillars and the pad portion are viewed in a plan view.

BRIEF DESCRIPTION OF THE DRAWINGS

The above and other features of the inventive concept will become more apparent by describing in detail exemplary embodiments thereof, with reference to the accompanying drawings, in which:

FIGS. 7A to 7H are sectional views, which are taken along I-I', II-II', III-III', and IV-IV', respectively, of FIG. 3 and illustrate a method of fabricating a semiconductor device according to some exemplary embodiments of the present inventive concept.

DETAILED DESCRIPTION

Figure 1:
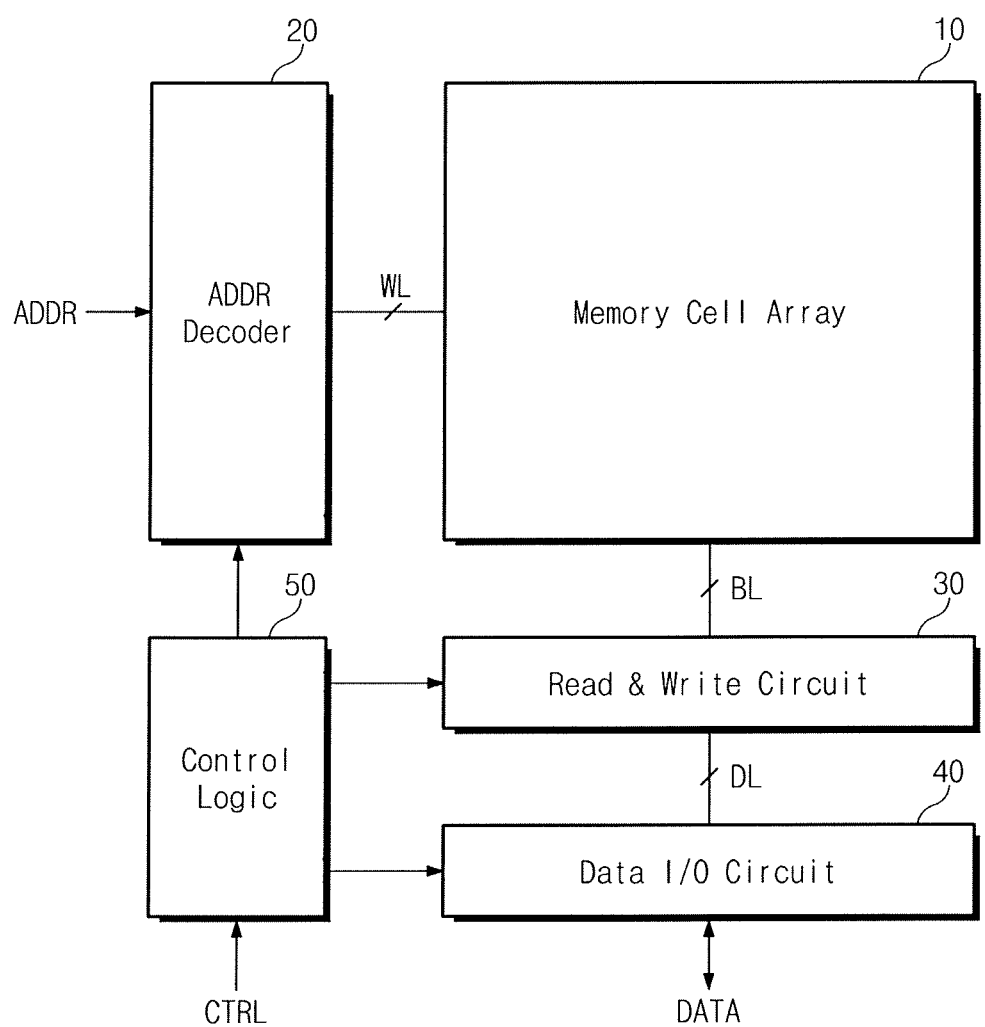
FIG. 1 is a block diagram illustrating a memory device according to some exemplary embodiments of the present inventive concept.

Various exemplary embodiments of the present inventive concept will be described in more detail below with reference to the accompanying drawings in which some exemplary embodiments of the present inventive concept are shown. Exemplary embodiments of the present inventive concept may, however, be embodied in many different forms and should not be construed as being limited to the embodiments set forth herein.

It will be understood that when an element is referred to as being "connected" or "coupled" to another element, it may be directly connected or coupled to the other element or intervening elements may be present.

It will be understood that when an element such as a layer, region or substrate is referred to as being "on" another element, it may be directly on the other element or intervening elements may be present. Exemplary embodiments of the present inventive concept may be described with sectional views as exemplary views of the inventive concept. Accordingly, shapes of the exemplary views may be modified according to, for example, manufacturing techniques and/or allowable errors. Thus, exemplary embodiments of the present inventive concept are not limited to the specific shape illustrated in the exemplary views, but may include other shapes that may be created according to, for example, manufacturing processes.

Some exemplary embodiments of the present inventive concept are illustrated in the drawings, in terms of functional blocks, units and/or modules. Those skilled in the art will appreciate that these blocks, units and/or modules may be physically implemented by electronic (or optical) circuits such as logic circuits, discrete components, microprocessors, hard-wired circuits, memory elements, wiring connections, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module according to some exemplary embodiments of the present inventive concept may be physically separated into two or more interacting and discrete blocks, units and/or modules without departing from the scope of the present inventive concept. The blocks, units and/or modules some exemplary embodiments of the present inventive concept may be physically combined into more complex blocks, units and/or modules without departing from the spirit and scope of the present inventive concept.

The same reference numerals or the same reference designators may denote the same elements throughout the specification and drawings.

FIG. 1 is a block diagram illustrating a memory device according to some exemplary embodiments of the present inventive concept. Referring to FIG. 1, a semiconductor device according to some exemplary embodiments of the present inventive concept may include a memory cell array 10, an ADDR (address) decoder 20, a read & write circuit 30, a data input/output circuit 40, and a control logic module 50.

The memory cell array 10 may be connected to the address decoder 20 through a plurality of word lines WL and may be connected to the read & write circuit 30 through at least one bit line of a plurality of bit lines BL. The memory cell array 10 may include a plurality of memory cells. For example, the memory cell array 10 may be configured to store one or more bits in each cell.

The address decoder 20 may be connected to the memory cell array 10 through the word lines WL. The address decoder 20 may be configured to operate in response to the control of the control logic module 50. The address decoder 20 may receive an address ADDR from outside the address decoder 20. The address decoder 20 may decode a row address, which is included in the received address ADDR, to select a corresponding one of the word lines WL. The address decoder 20 may be configured to decode a column address, which is included in the address ADDR, and transfer the decoded column address to the read & write circuit 30. For example, the address decoder 20 may include a row decoder, a column decoder, and an address buffer.

The read & write circuit 30 may be connected to the memory cell array 10 through the bit lines BL and may be connected to the data input/output circuit 40 through at least one data line of a plurality of data lines DL. The read & write circuit 30 may operate in response to the control of the control logic module 50. The read & write circuit 30 may be configured to receive the column address decoded by the address decoder 20. The read & write circuit 30 may select one of the bit lines BL, based on the decoded column address. The read & write circuit 30 may be configured to receive data from the data input/output circuit 40 and write the received data in the memory cell array 10. The read & write circuit 30 may be configured to read data from the memory cell array 10 and transfer the read data to the data input/output circuit 40. The read & write circuit 30 may be configured to read data from a first storage region of the memory cell array 10 and write the read data in a second storage region of the memory cell array 10. For example, the read & write circuit 30 may be configured to perform a copy-back operation.

The read & write circuit 30 may be configured to include elements, such as a page buffer (or a page register) and a column selection circuit. For example, the read & write circuit 30 may include components, such as a sense amplifier, a write driver, and a column selection circuit.

The data input/output circuit 40 may be connected to the read & write circuit 30 through the data lines DL. The data input/output circuit 40 may be configured to operate in response to the control of the control logic module 50. The data input/output circuit 40 may be configured to exchange data DATA with outside the data input/output circuit 40. The data input/output circuit 40 may be configured to transfer the data DATA, which is provided from the outside, to the read & write circuit 30 through the data lines DL. The data input/output circuit 40 may be configured to output the data DATA, which is provided from the read & write circuit 30, to the outside through the data lines DL. For example, the data input/output circuit 40 may include a component, such as a data buffer.

The control logic module 50 may be connected to the address decoder 20, the read & write circuit 30, and the data input/output circuit 40. The control logic module 50 may be configured to control the operation of the semiconductor memory device. The control logic module 50 may operate in response to a control signal CTRL transferred outside the control logic module 50.

Figure 2:
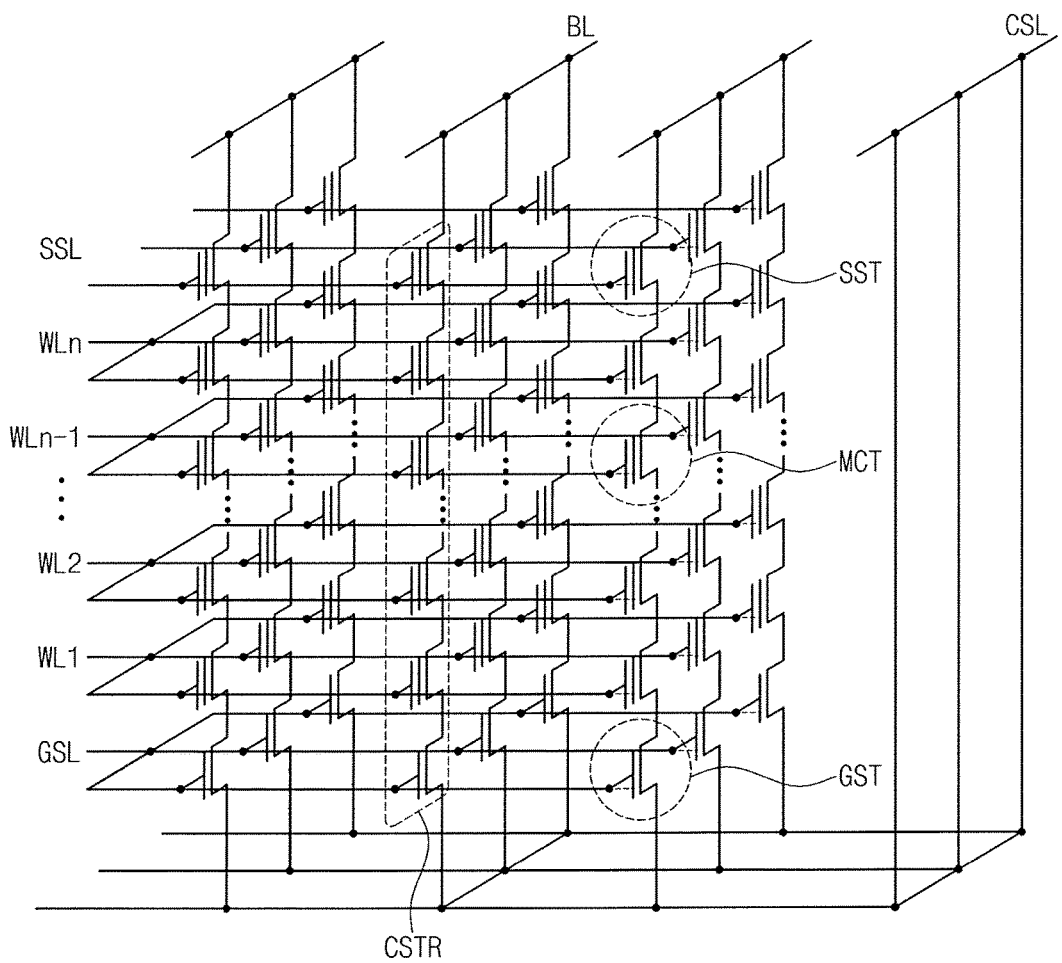
FIG. 2 is a schematic circuit diagram illustrating a cell array of a three-dimensional semiconductor memory device according to some exemplary embodiments of the present inventive concept.

FIG. 2 is a schematic circuit diagram illustrating a cell array of a three-dimensional semiconductor memory device according to some exemplary embodiments of the present inventive concept.

Referring to FIG. 2, a three-dimensional semiconductor memory device according to some exemplary embodiments of the present inventive concept may include a cell array. The cell array may include at least one common source line CSL, a plurality of bit lines BL, and a plurality of cell strings CSTR disposed between the common source line CSL and the bit lines BL.

The common source line CSL may include a conductive layer disposed on a substrate or an impurity region formed in the substrate. The bit lines BL may include conductive patterns (e.g., metal lines) spaced apart from the substrate and disposed over the substrate. The bit lines BL may be two-dimensionally arranged and a plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In some exemplary embodiments of the present inventive concept, a plurality of common source lines CSL may be two-dimensionally arranged on the substrate. In some exemplary embodiments of the present inventive concept, the common source lines CSL may be applied with the same voltage, but in some exemplary embodiments of the present inventive concept, the common source lines CSL may be separated from each other and may thus be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the string selection transistor SST, and the memory cell transistors MCT may be connected in series.

The common source line CSL may be connected in common to source regions of the ground selection transistors GST. A ground selection line GSL, a plurality of word lines WL1-WLn, and a plurality of string selection lines SSL, which are disposed between the common source line CSL and the bit lines BL, may serve as gate electrodes of the ground selection transistor GST, the memory cell transistors MCT and the string selection transistors SST. Each of the memory cell transistors MCT may include a data storage element.

Figure 3:
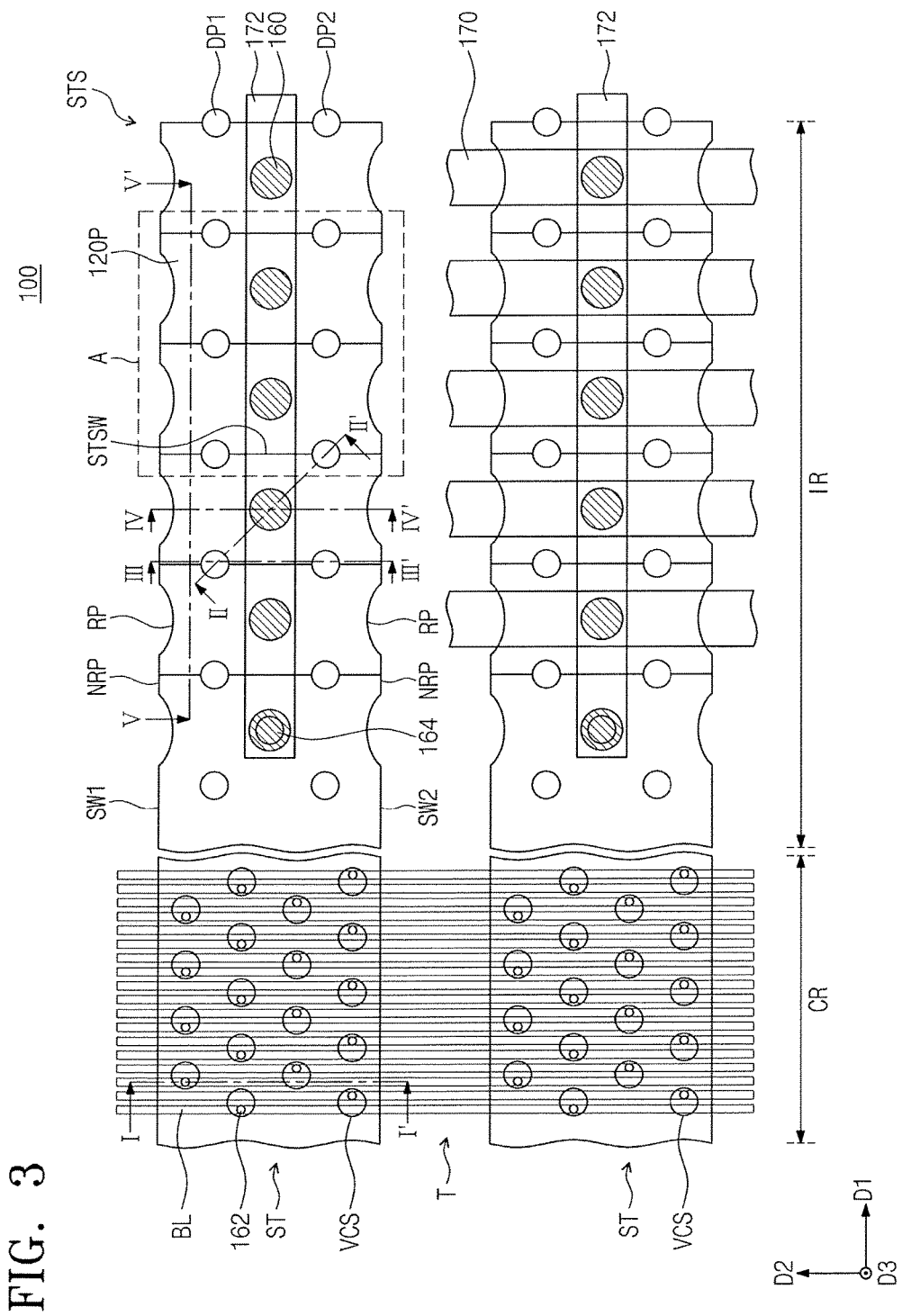
FIG. 3 is a plan view illustrating a semiconductor device according to some exemplary embodiments of the present inventive concept.
Figure 4:
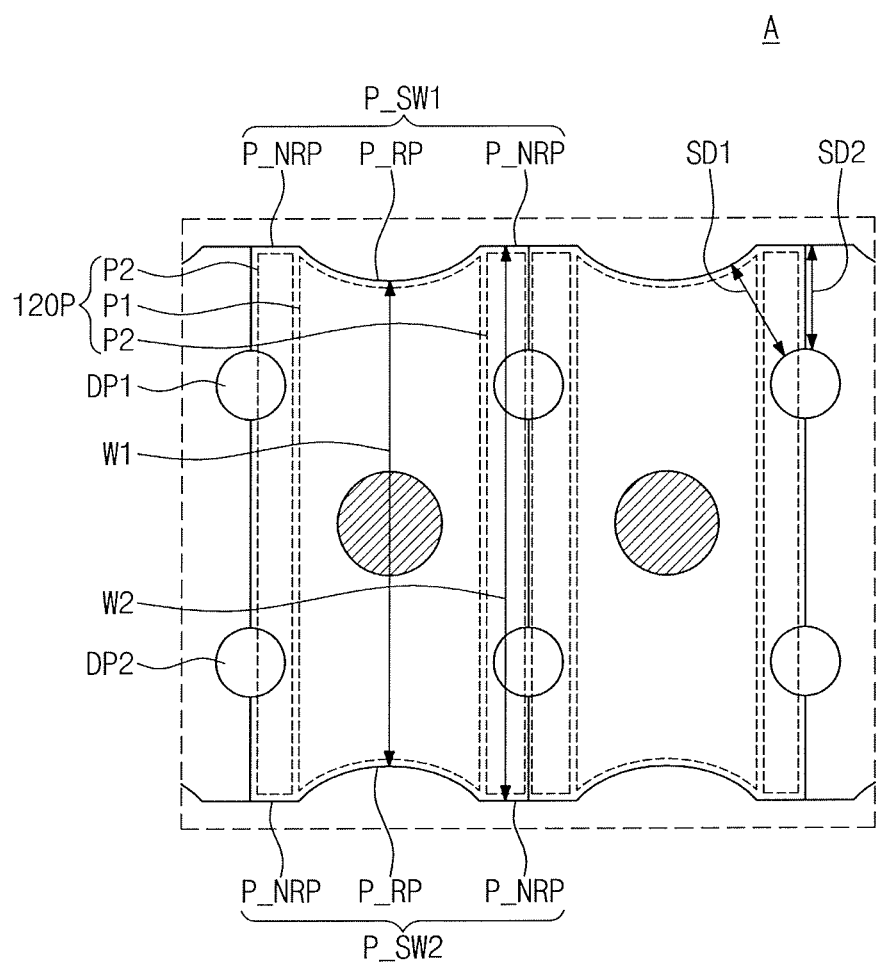
FIG. 4 is an enlarged view illustrating a portion 'A' of FIG. 3.
Figure 5A:
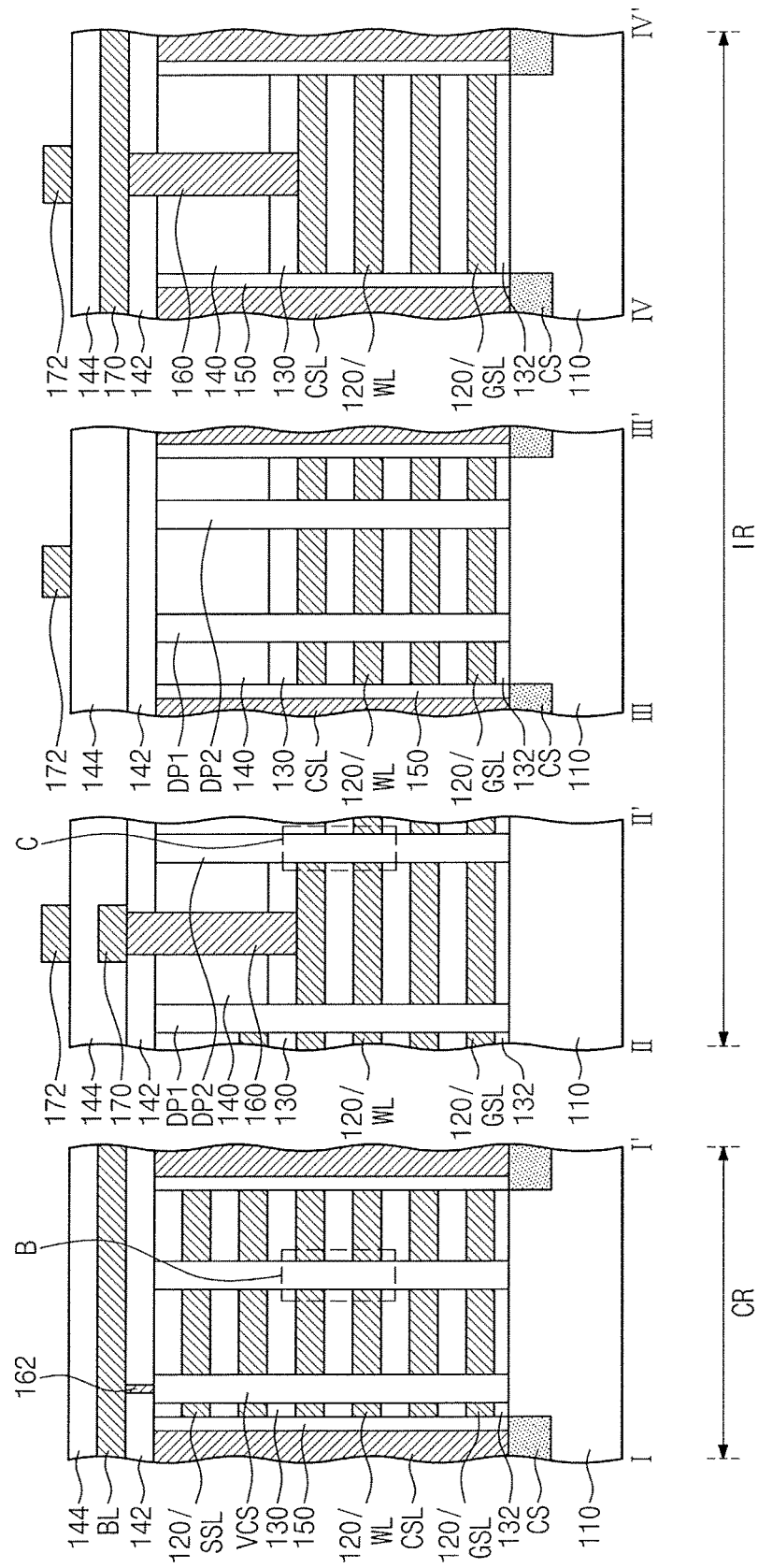
FIG. 5A is sectional views taken along lines I-I', II-II', III-III', and IV-IV', respectively, of FIG. 3.
Figure 5B:
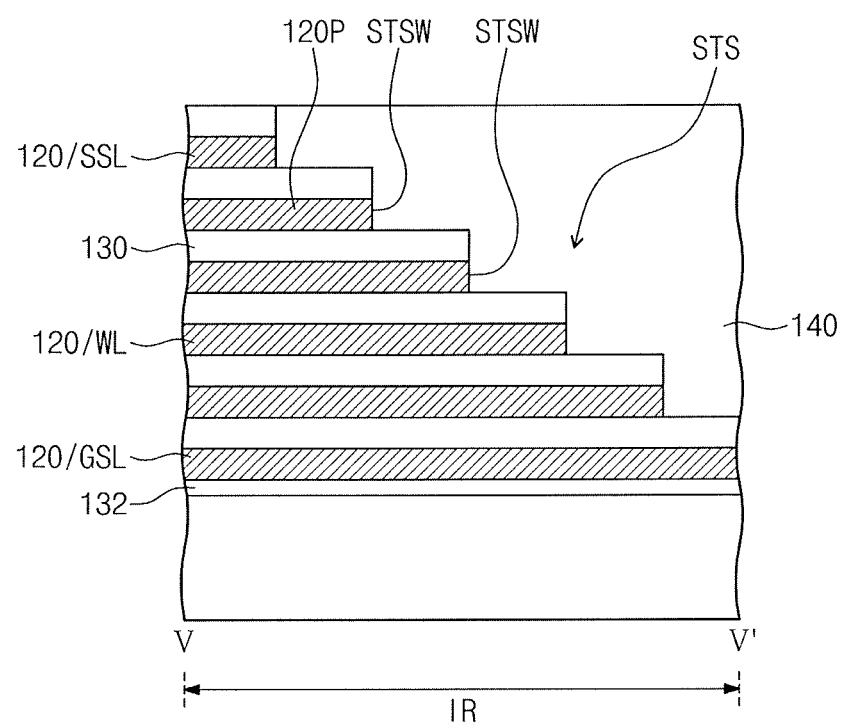
FIG. 5B is a sectional view taken along line V-V' of FIG. 3.

FIG. 3 is a plan view illustrating a semiconductor device according to some exemplary embodiments of the present inventive concept. FIG. 4 is an enlarged view illustrating a portion 'A' of FIG. 3. FIG. 5A is sectional views taken along lines I-I', and IV-IV', respectively, of FIG. 3, and FIG. 5B is a sectional view taken along line V-V' of FIG. 3.

Referring to FIGS. 3, 4, 5A, and 5B, a semiconductor device 100 may include a substrate 110, stacks ST, vertical channel structures VCS, and dummy pillars DP1 and DP2.

The substrate 110 may include a cell region CR and a connection region IR. The substrate 110 may be a semiconductor substrate (e.g., a silicon wafer, a germanium wafer, or a silicon-germanium wafer). A plurality of memory cells may be three-dimensionally arranged in the cell region CR. Contact plugs 160 may be disposed in the connection region IR and may be used to apply a voltage to the memory cells.

The stacks ST may be disposed on the substrate 110. The stacks ST may extend in a first direction D1 and may be parallel to each other. The stacks ST may be spaced apart from each other in a second direction D2 crossing (e.g., perpendicular to) the first direction D1. Both of the first and second directions D1 and D2 may be parallel to a top surface of the substrate 110.

Each of the stacks ST may include electrode patterns 120 and insulating patterns 130 which are alternatingly and repeatedly stacked on the substrate 110. The electrode patterns 120 may be electrically insulated from each other by the insulating patterns 130. The lowermost one (e.g., GSL) of the electrode patterns 120 may serve as the ground selection line. The uppermost one (e.g., SSL) of the electrode patterns 120 may serve as the string selection line. Others (e.g., WL) of the electrode patterns 120 disposed between the ground and string selection lines GSL and SSL may serve as the word lines. A buffer dielectric pattern 132 may be disposed between the ground selection line GSL and the substrate 110. The buffer dielectric pattern 132 may be thinner than each of the insulating patterns 130. The electrode patterns 120 may be formed of or may include at least one conductive material (e.g., tungsten (W)), and the insulating patterns 130 and the buffer dielectric pattern 132 may be formed of or may include at least one insulating material (e.g., silicon oxide).

Each of the stacks ST may extend from the cell region CR to the connection region IR of the substrate 110. Each of the stacks ST may have a staircase structure STS in the connection region IR. The staircase structure STS may include first and second sidewalls SW1 and SW2 extending in the first direction D1. The first and second sidewalls SW1 and SW2 may be on opposite sides of the stack ST.

The first sidewall SW1 may include recessed portions RP and non-recessed portions NRP. Each of the recessed portions RP may be recessed with respect to the non-recessed portions NRP. Each of the recessed portions RP may extend in a third direction D3 substantially perpendicular to the substrate 110. Each of the recessed portions RP may be a trench-shaped region that is formed on the first sidewall SW1 and extend in the third direction D3. In some exemplary embodiments of the present inventive concept, each of the recessed portions RP may have a trench shape including a surface that is concavely curved toward an inner region of each stack ST. The recessed and non-recessed portions RP and NRP may be formed in an alternating manner along the first direction D1, and thus, the first sidewall SW1 may have an uneven profile.

In some exemplary embodiments of the present inventive concept, the second sidewall SW2 may include the recessed and non-recessed portions RP and NRP. The recessed and non-recessed portions RP and NRP of the second sidewall SW2 may be configured to have substantially the same shapes and dimensions as those of the first sidewall SW1.

The staircase structure STS may include a plurality of staircase sidewalls STSW. The staircase sidewalls STSW may extend in the second direction D2. In each of the stacks ST, the staircase sidewalls STSW may be arranged in the first direction D1 and may have vertical heights or levels decreasing in the first direction D1. In some exemplary embodiments of the present inventive concept, each of the staircase sidewalls STSW may connect the non-recessed portions NRP of the first and second sidewalls SW1 and SW2 to each other.

In each of the stacks ST, the electrode patterns 120 may include the staircase structure STS in the connection region IR. For example, each of the electrode patterns 120 may include a pad portion 120P that is not covered by another of the electrode patterns 120.

The pad portion 120P may include a first pad sidewall P_SW1 and a second pad sidewall P_SW2 extending substantially parallel to the first direction D1. The first and second pad sidewalls P_SW1 and P_SW2 may be opposite to each other. The first pad sidewall P_SW1 may be a part of the first sidewall SW1 of the staircase structure STS, and the second pad sidewall P_SW2 may be a part of the second sidewall SW2 of the staircase structure STS.

The first pad sidewall P_SW1 may include a pad recessed portion P_RP that is recessed in a direction crossing the first direction D1 (e.g., opposite to the second direction D2). The pad recessed portion P_RP of the first pad sidewall P_SW1 may be a part of the recessed portion RP of the first sidewall SW1. Thus, in some exemplary embodiments of the present inventive concept, the pad recessed portion P_RP may have a trench shape including a surface that is concavely curved toward the inner region of each stack ST, and which extends in the third direction D3. The first pad sidewall P_SW1 may include a pad non-recessed portion P_NRP. The pad non-recessed portion P_NRP of the first pad sidewall P_SW1 may be a part of the non-recessed portion NRP of the first sidewall SW1.

The pad portion 120P may include a first portion P1 and a second portion P2. The first portion P1 may be a portion extending from the pad recessed portion P_RP of the first pad sidewall P_SW1 to the second pad sidewall P_SW2 in the second direction D2. The second portion P2 may be a portion extending from the pad non-recessed portion P_NRP of the first pad sidewall P_SW1 to the second pad sidewall P_SW2 in the second direction D2. When measured in the second direction D2, a width W1 of the first portion P1 may be smaller than a width W2 of the second portion P2. The second portion P2 may include a plurality of second portions P2. For example, the second par portion P2 may include two second pad portions P2. When viewed in a plan view, each of the second portions P2 may be adjacent to a boundary or interface between the pad portions 120P. Thus, when viewed in a plan view, the first portion P1 may be spaced apart from the boundary between the pad portions 120P, and the pad recessed portion P_RP and the recessed portion RP may also be spaced apart from the boundary between the pad portions 120P.

In some exemplary embodiments of the present inventive concept, the second pad sidewall P_SW2 may include the pad recessed portion P_RP, which may be recessed in a direction crossing the first direction D1 (e.g., the second direction D2), and the pad non-recessed portion P_NRP. The pad recessed portion P_RP and the pad non-recessed portion P_NRP of the second pad sidewall P_SW2 may be substantially the same as the pad recessed portion P_RP and the pad non-recessed portion P_NRP of the first pad sidewall P_SW1. In some exemplary embodiments of the present inventive concept, the pad recessed portion P_RP of the second pad sidewall P_SW2 may be included in the first portion P1; however, exemplary embodiments of the present inventive concept are not limited thereto.

In each of the stacks ST, the insulating patterns 130 may have the staircase structure STS in the connection region IR. For example, each of the insulating patterns 130 may have substantially the same length in the first direction D1 as one of the electrode patterns 120 disposed under a corresponding insulating pattern 130 of the insulating patterns 130.

A first interlayered insulating layer 140 may be included in each of the stacks ST. The first interlayered insulating layer 140 may cover the staircase structure STS in the connection region IR. The first interlayered insulating layer 140 may be formed of or may include an insulating material (e.g., silicon oxide).

The vertical channel structures VCS may be disposed in the cell region CR of the substrate 110 and may penetrate each of the stacks ST. The vertical channel structures VCS may pass through each of the stacks ST and may be in contact with the substrate 110. Each of the vertical channel structures VCS may include a semiconductor layer. The vertical channel structures VCS will be described in more detail with reference to FIGS. 6A to 6D.

Referring to FIG. 3, when viewed in a plan view, the vertical channel structures VCS may be two-dimensionally arranged in the cell region CR of the substrate 110. For example, the vertical channel structures VCS may be disposed to form a plurality of rows parallel to the first direction D1. The vertical channel structures VCS of an adjacent two of the rows may be disposed to form a zigzag arrangement along the first direction D1. In some exemplary embodiments of the present inventive concept, the number of the rows may be four; however, exemplary embodiments of the present inventive concept are not limited thereto.

The dummy pillars DP1 and DP2 may be disposed in the connection region IR of the substrate 110 and may penetrate each of the stacks ST. The dummy pillars DP1 and DP2 may pass through each of the stacks ST and may be in contact with the substrate 110. Referring to FIG. 5A, the dummy pillars DP1 and DP2 may have top surfaces that are positioned at substantially the same level (e.g., height) as those of the vertical channel structures VCS. The dummy pillars DP1 and DP2 may have bottom surfaces that are positioned at substantially the same level (e.g., height) as those of the vertical channel structures VCS. The dummy pillars DP1 and DP2 may be formed of or may include the same material as the vertical channel structures VCS. The dummy pillars DP1 and DP2 will be described in more detail with reference to FIGS. 6A to 6D.

The dummy pillars DP1 and DP2 may penetrate the pad portion 120P of each of the electrode patterns 120 and a portion of the stack ST below the pad portion 120P. The dummy pillars DP1 and DP2 may penetrate the insulating patterns 130 and the first interlayered insulating layer 140 covering the pad portions 120P. The dummy pillars DP1 and DP2 may include first dummy pillars DP1, which are arranged in the first direction D1, and second dummy pillars DP2, which are arranged in the first direction D1 and are spaced apart from the first dummy pillars DP1 in the second direction D2. In some exemplary embodiments of the present inventive concept, each of the second dummy pillars DP2 may be aligned to a corresponding one of the first dummy pillars DP1 in the second direction D2.

When viewed in a plan view, the dummy pillars DP1 and DP2 may be overlapped with the staircase sidewalls STSW. When viewed in a plan view, the dummy pillars DP1 and DP2 may be overlapped with a boundary between an adjacent pair of the pad portions 120P. In this case, the dummy pillars DP1 and DP2 may pass through the second portions P2 of the adjacent pair of the pad portions 120P. In some exemplary embodiments of the present inventive concept, when viewed in a plan view, a minimum SD1 of distances from each of the dummy pillars DP1 and DP2 to the recessed portion RP may be greater than or equal to a minimum SD2 of distances from each of the dummy pillars DP1 and DP2 to the non-recessed portion NRP; however, exemplary embodiments of the present inventive concept are not limited thereto.

In some exemplary embodiments of the present inventive concept, the number of the dummy pillars DP1 and DP2 passing through each of the pad portions 120P may be four, and two of the four dummy pillars DP1 and DP2 may be shared by each adjacent pair of the pad portions 120P. In some exemplary embodiments of the present inventive concept, at least one additional dummy pillar may further pass through each of the pad portions 120P, as will be described in more detail below with reference to FIG. 8 or 9.

Common source regions CS may be disposed in portions of the substrate 110 exposed at both sides of each of the stacks ST. The substrate 110 may be doped to have a first conductivity type, and the common source regions CS may be doped to have a second conductivity type different from the first conductivity type. The common source lines CSL may be disposed at both sides of each of the stacks ST and may be connected to the common source regions CS. The common source lines CSL may be formed of or may include at least one of conductive or metallic materials (e.g., tungsten). Insulating spacers 150 may be disposed between the stacks ST and the common source lines CSL. The insulating spacers 150 may be formed of or may include at least one of silicon oxide, silicon nitride, or silicon oxynitride. A second interlayered insulating layer 142 may be disposed on top surfaces of the stacks ST. The second interlayered insulating layer 142 may cover the top surfaces of the stacks ST and may be extended to cover top surfaces of the insulating spacers 150 and the common source lines CSL. The second interlayered insulating layer 142 may be formed of or may include at least one of silicon oxide, silicon nitride, or silicon oxynitride.

The contact plugs 160 may be disposed in the connection region IR of the substrate 110. The contact plugs 160 may be connected to the pad portions 120P of the electrode patterns 120, respectively. Each of the contact plugs 160 may pass through the insulating pattern 130, the first interlayered insulating layer 140, and the second interlayered insulating layer 142 that are disposed on the pad portion 120P. In some exemplary embodiments of the present inventive concept, each of the contact plugs 160 may be connected to a center region of a corresponding one of the pad portions 120P; however, exemplary embodiments of the present inventive concept are not limited thereto.

The bit lines BL may be disposed on the second interlayered insulating layer 142 of the cell region CR. The bit lines BL may extend in the second direction D2 and may be spaced apart from each other in the first direction D1. Each of the bit lines BL may be connected to a plurality of the vertical channel structures VCS. For example, each of the vertical channel structures VCS may be electrically connected to a corresponding one of the bit lines BL through a bit line contact plug 162 passing through the second interlayered insulating layer 142.

First interconnection lines 170 may be disposed on the second interlayered insulating layer 142 of the connection region IR. The first interconnection lines 170 may extend in the second direction D2 and may be spaced apart from each other in the first direction D1. The first interconnection lines 170 may be electrically connected to the pad portions 120P of the word lines WL and the ground selection line GSL of each of the stacks ST. In some exemplary embodiments of the present inventive concept, the first interconnection lines 170 may be disposed at substantially the same level (e.g., height) as the bit lines BL; however, exemplary embodiments of the present inventive concept are not limited thereto.

A third interlayered insulating layer 144 may be disposed on the second interlayered insulating layer 142, the bit lines BL, and the first interconnection lines 170. The third interlayered insulating layer 144 may be formed of or may include at least one of silicon oxide, silicon nitride, or silicon oxynitride.

Second interconnection lines 172 may be disposed on the third interlayered insulating layer 144. In some exemplary embodiments of the present inventive concept, the second interconnection lines 172 may extend in the first direction D1 and may be spaced apart from each other in the second direction D2; however, exemplary embodiments of the present inventive concept are not limited thereto. Each of the second interconnection lines 172 may be electrically connected to the string selection line SSL. For example, the string selection line SSL may be electrically connected to a corresponding one of the second interconnection lines 172 through an interconnection line plug 164 passing through the third interlayered insulating layer 144.

According to some exemplary embodiments of the present inventive concept, the dummy pillars DP1 and DP2 may penetrate the staircase structure STS in the connection region IR and may be in contact with the substrate 110. The dummy pillars DP1 and DP2 may support the insulating patterns 130, when a replacement process is performed to form the electrode patterns 120.

According to some exemplary embodiments of the present inventive concept, at least one of two opposite sidewalls (e.g., the first and second sidewalls SW1 and SW2) of the staircase structure STS may have the recessed portions RP. Thus, an area or volume of the insulating patterns 130, which are supported by the dummy pillars DP1 and DP2, may be reduced during the replacement process.

According to some exemplary embodiments of the present inventive concept, when viewed in a plan view, the recessed portion RP may be formed at a position that is relatively far from the dummy pillars DP1 and DP2. For example, in the case where the dummy pillars DP1 and DP2 are formed to be overlapped with the boundary between the pad portions 120P in a plan view, the recessed portions RP may be spaced apart from the boundary between the pad portions 120P. The formation of the recessed portions RP may result in partial removal of the insulating patterns 130 at regions that are relatively far from the dummy pillars DP1 and DP2. As a result of the partial removal of the insulating patterns 130, the insulating patterns 130 may be more effectively supported by the dummy pillars DP1 and DP2, during the replacement process.

Thus, it is possible to reduce or prevent an occurrence of the insulating patterns 130 collapsing during the replacement process for forming the electrode patterns 120 and consequently, increase reliability of the semiconductor device 100.

Figure 6A:
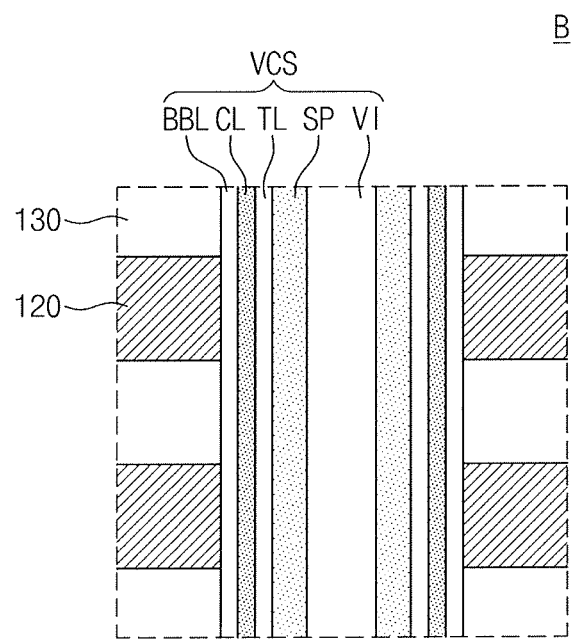
FIGS. 6A to 6D are enlarged sectional views, each of which illustrates portions 'B' and 'C' of FIG. 5A.
Figure 6A:
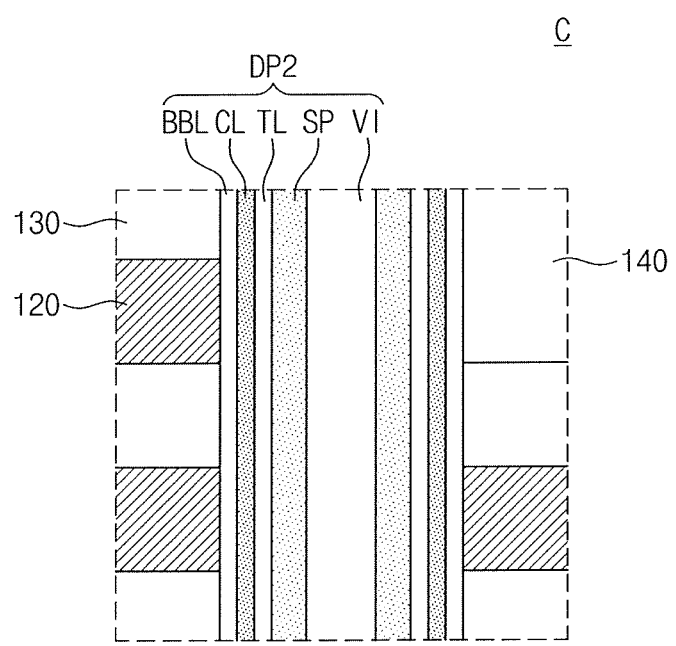

FIGS. 6A to 6D are enlarged sectional views, each of which illustrates portions 'B' and 'C' of FIG. 5A. FIG. 6A illustrates an example of the vertical channel structure and the dummy pillar according to some exemplary embodiments of the present inventive concept.

Referring to FIG. 6A, the vertical channel structure VCS may include a vertical semiconductor pattern SP extending upward from the substrate 110. The vertical channel structure VCS may include a blocking insulating layer BBL, a charge storing layer CL, and a tunnel insulating layer TL that are disposed between the electrode pattern 120 and the vertical semiconductor pattern SP. The blocking insulating layer BBL may be adjacent to the electrode pattern 120, and the tunnel insulating layer TL may be adjacent to the vertical semiconductor pattern SP. The charge storing layer CL may be between the blocking insulating layer BBL and the tunnel insulating layer TL. For example, the tunnel insulating layer TL may include at least one of a silicon oxide layer or a silicon oxynitride layer. The charge storing layer CL may include at least one of a silicon nitride layer with trap sites or an insulating layer including conductive nanodots. The blocking insulating layer BBL may be formed of or may include at least one high-k dielectric material. The at least one high-k dielectric material may have a dielectric constant that is higher than that of the tunnel insulating layer TL. The blocking insulating layer BBL may include a barrier insulating layer (e.g., a silicon oxide layer) with an energy band gap that is larger than that of the high-k dielectric material.

In some exemplary embodiments of the present inventive concept, each of the blocking insulating layer BBL, the charge storing layer CL, and the tunnel insulating layer TL may include a portion that is extended in a direction perpendicular to the top surface of the substrate 110 and is disposed between the vertical semiconductor pattern SP and the insulating pattern 130. The vertical semiconductor pattern SP may have a macaroni or pipe shape, and, in this case, the vertical channel structure VCS may include a vertical insulating pattern VI filling an inner space of the vertical semiconductor pattern SP. For example, the vertical insulating pattern VI may be formed of or may include silicon oxide.

The dummy pillar DP2 may be formed of or may include a same material as the vertical channel structure VCS. In some exemplary embodiments of the present inventive concept, the dummy pillar DP2 may include the blocking insulating layer BBL, the charge storing layer CL, the tunnel insulating layer TL, the vertical semiconductor pattern SP, and the vertical insulating pattern VI.

Figure 6B:
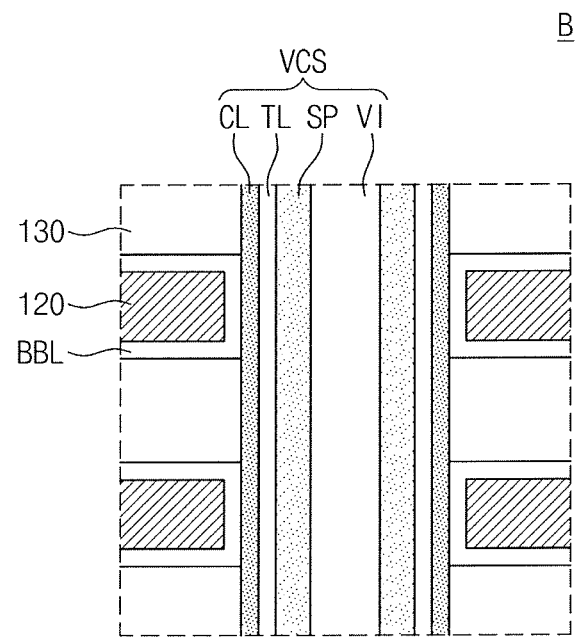
Figure 6B:
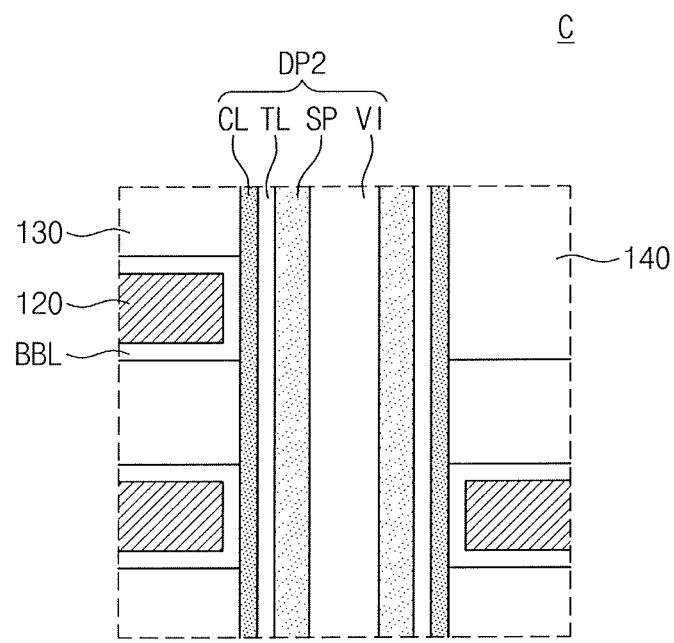

FIG. 6B illustrates another examples of the vertical channel structure and the dummy pillar according to some exemplary embodiments of the present inventive concept.

Referring to FIG. 6B, the vertical channel structure VCS may include the vertical semiconductor pattern SP extending upward from the substrate 110. The vertical channel structure VCS of FIG. 6B may include the charge storing layer CL and the tunnel insulating layer TL that are disposed between the electrode pattern 120 and the vertical semiconductor pattern SP. In some exemplary embodiments of the present inventive concept, the blocking insulating layer BBL may be disposed between the electrode pattern 120 and the vertical channel structure VCS and may include a portion that is extended in a direction parallel to the top surface of the substrate 110 or is disposed between the electrode pattern 120 and the insulating patterns 130. The charge storing layer CL may be disposed between the blocking insulating layer BBL and the tunnel insulating layer TL. The vertical semiconductor pattern SP may have a macaroni or pipe shape, and, in this case, the vertical channel structure VCS may include the vertical insulating pattern VI filling an inner space of the vertical semiconductor pattern SP.

The dummy pillar DP2 may be formed of or may include the same material as the vertical channel structure VCS. In some exemplary embodiments of the present inventive concept, the dummy pillar DP2 may include the charge storing layer CL, the tunnel insulating layer TL, the vertical semiconductor pattern SP, and the vertical insulating pattern VI.

Figure 6C:
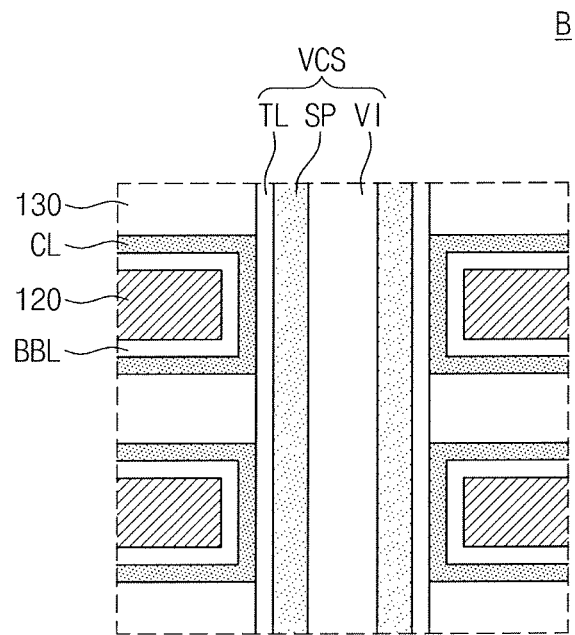
Figure 6C:
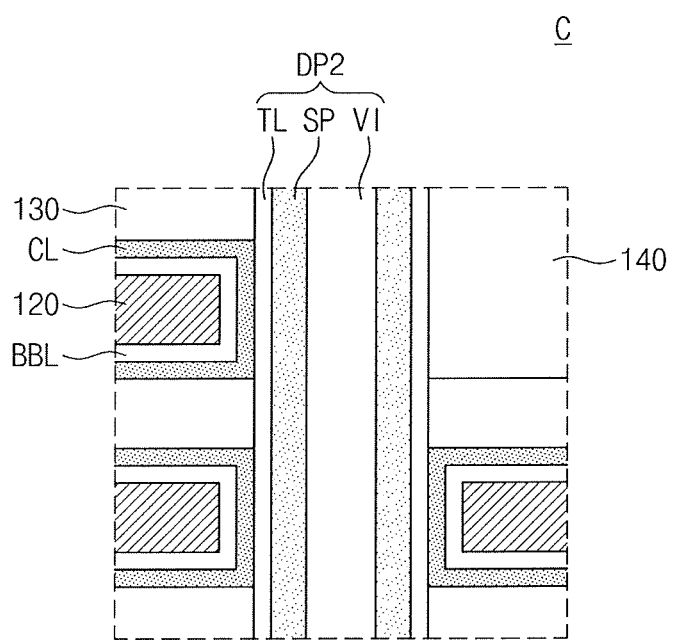

FIG. 6C illustrates other example of the vertical channel structure and the dummy pillar according to some exemplary embodiments of the present inventive concept.

Referring to FIG. 6C, the vertical channel structure VCS may include the vertical semiconductor pattern SP extending upward from the substrate 110. The vertical channel structure VCS of FIG. 6C may include the tunnel insulating layer TL that is disposed between the electrode pattern 120 and the vertical semiconductor pattern SP. In some exemplary embodiments of the present inventive concept, the blocking insulating layer BBL and the charge storing layer CL may be disposed between the electrode pattern 120 and the vertical channel structure VCS. Each of the blocking insulating layer BBL and the charge storing layer CL may include a portion that is extended in a direction parallel to the top surface of the substrate 110 or is disposed between the electrode pattern 120 and the insulating patterns 130. The charge storing layer CL may be disposed between the blocking insulating layer BBL and the tunnel insulating layer TL. The vertical semiconductor pattern SP may have a macaroni or pipe shape, and, in this case, the vertical channel structure VCS may include the vertical insulating pattern VI filling an inner space of the vertical semiconductor pattern SP.

The dummy pillar DP2 may be formed of or may include a same material as the vertical channel structure VCS. In some exemplary embodiments of the present inventive concept, the dummy pillar DP2 may include the tunnel insulating layer TL, the vertical semiconductor pattern SP, and the vertical insulating pattern VI.

Figure 6D:
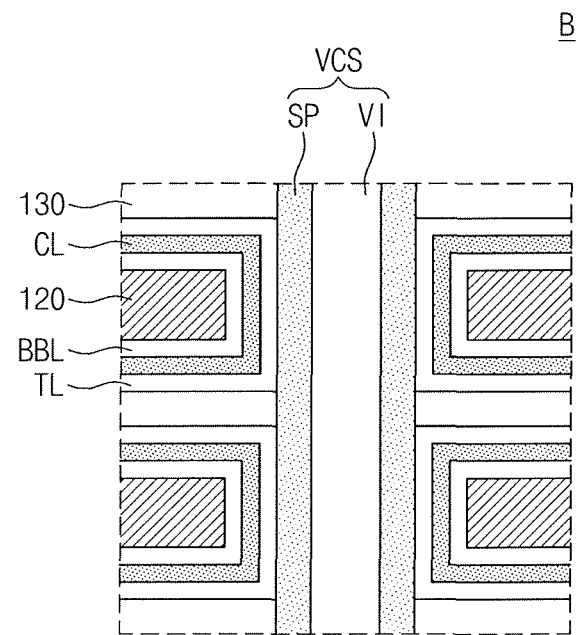
Figure 6D:
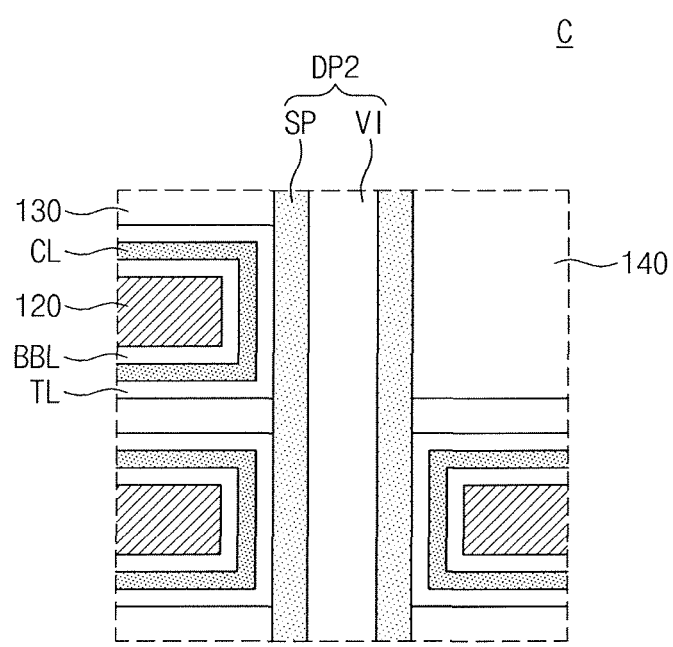

FIG. 6D illustrates still other example of the vertical channel structure and the dummy pillar according to some exemplary embodiments of the present inventive concept.

Referring to FIG. 6D, the vertical channel structure VCS may include the vertical semiconductor pattern SP extending upward from the substrate 110. In some exemplary embodiments of the present inventive concept, the blocking insulating layer BBL, the charge storing layer CL, and the tunnel insulating layer TL may be disposed between the electrode pattern 120 and the vertical channel structure VCS. Each of the blocking insulating layer BBL, the charge storing layer CL, and the tunnel insulating layer TL may include a portion that is extended in a direction parallel to the top surface of the substrate 110 or is disposed between the electrode pattern 120 and the insulating patterns 130. The charge storing layer CL may be disposed between the blocking insulating layer BBL and the tunnel insulating layer TL. The vertical semiconductor pattern SP may have a macaroni or pipe shape, and, in this case, the vertical channel structure VCS may include the vertical insulating pattern VI filling an inner space of the vertical semiconductor pattern SP.

The dummy pillar DP2 may be formed of or may include the same material as the vertical channel structure VCS. In some exemplary embodiments of the present inventive concept, the dummy pillar DP2 may include the vertical semiconductor pattern SP and the vertical insulating pattern VI.

FIGS. 7A to 7H are sectional views, which are taken along I-I', II-II', III-III', and IV-IV', respectively, of FIG. 3 and illustrate a method of fabricating a semiconductor device according to some exemplary embodiments of the present inventive concept. Components previously described with reference to FIGS. 3, 4, 5A, and 5B may be identified by a similar or identical reference number without repeating an overlapping description, and thus duplicative descriptions may be omitted.

Figure 7A:
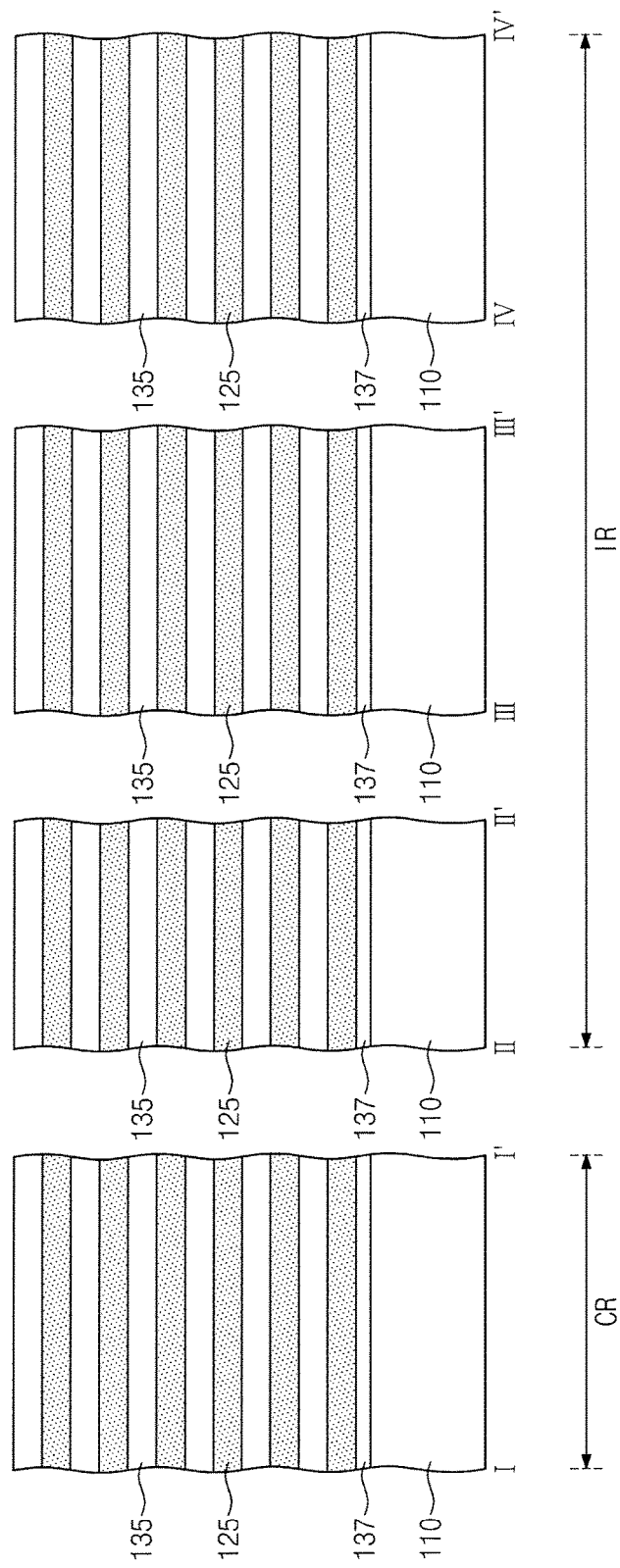

Referring to FIGS. 3 and 7A, a buffer dielectric layer 137 may be formed on the substrate 110 including the cell region CR and the connection region IR. Sacrificial layers 125 and insulating layers 135 may be alternatingly formed on the substrate 110 including the buffer dielectric layer 137. The sacrificial layers 125 may be formed of or may include a material having an etch selectivity with respect to the buffer dielectric layer 137 and the insulating layers 135. For example, the buffer dielectric layer 137 and the insulating layers 135 may be formed of or may include silicon oxide, and the sacrificial layers 125 may be formed of or may include silicon nitride.

Figure 7B:
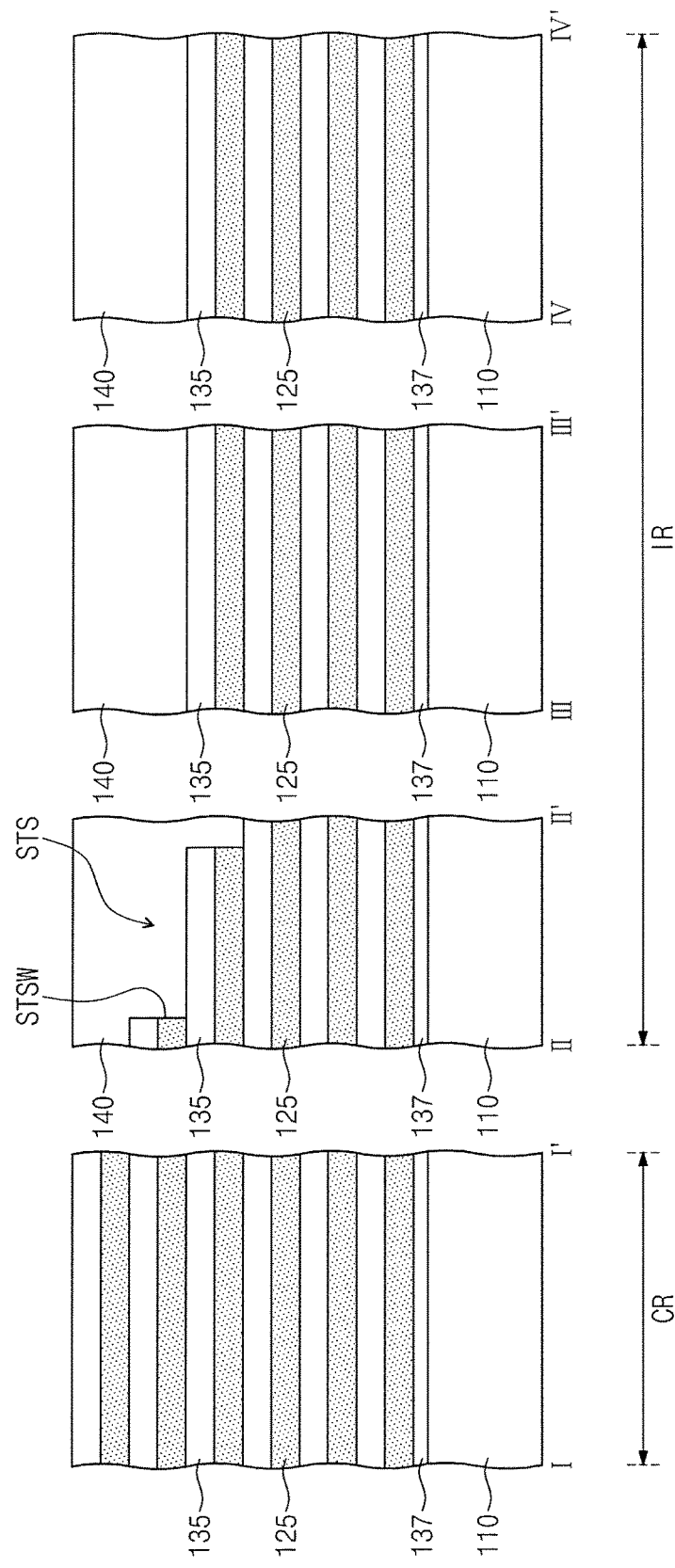

Referring to FIGS. 3 and 7B, the sacrificial layers 125 and the insulating layers 135 in the connection region IR may be patterned to form the staircase structure STS. The staircase structure STS may include a plurality of the staircase sidewalls STSW. The staircase sidewalls STSW may extend in the second direction D2. In each of the stacks ST, the staircase sidewalls STSW may be arranged in the first direction D1 and may have vertical heights or levels decreasing in the first direction D1.

Thus, the first interlayered insulating layer 140 may be formed on the substrate 110, and a planarization process may be performed on the first interlayered insulating layer 140. In some exemplary embodiments of the present inventive concept, the planarization process may include etching or polishing the first interlayered insulating layer 140 to expose the uppermost layer of the insulating layers 135 in the cell region CR. In some exemplary embodiments of the present inventive concept, at least a portion of the first interlayered insulating layer 140 may remain on the uppermost layer of the insulating layers 135, even after the planarization process.

Referring to FIGS. 3 and 7C, the insulating layers 135, the sacrificial layers 125, and the buffer dielectric layer 137 in the cell region CR may be sequentially patterned to form vertical holes H1 exposing the substrate 110. The first interlayered insulating layer 140, the insulating layers 135, the sacrificial layers 125, and the buffer dielectric layer 137 in the connection region IR may be sequentially patterned to form dummy holes H2 exposing the substrate 110. The vertical holes H1 and the dummy holes H2 may be formed substantially at the same time using the same process.

The vertical holes H1 may have the same arrangement as that of the vertical channel structures VCS described with reference to FIG. 3. The dummy holes H2 may have the same arrangement as that of the dummy pillars DP1 and DP2 described with reference to FIG. 3. When viewed in a plan view, the dummy pillars DP1 and DP2 may be overlapped with the staircase sidewalls STSW.

The vertical channel structures VCS may be formed in the vertical holes H1, respectively, and the dummy pillars DP1 and DP2 may be formed in the dummy holes H2, respectively. The vertical channel structures VCS and the dummy pillars DP1 and DP2 may be formed substantially at the same time using the same process. The vertical channel structures VCS and the dummy pillars DP1 and DP2 may include one of the structures described with reference to FIGS. 6A to 6D.

Figure 7D:
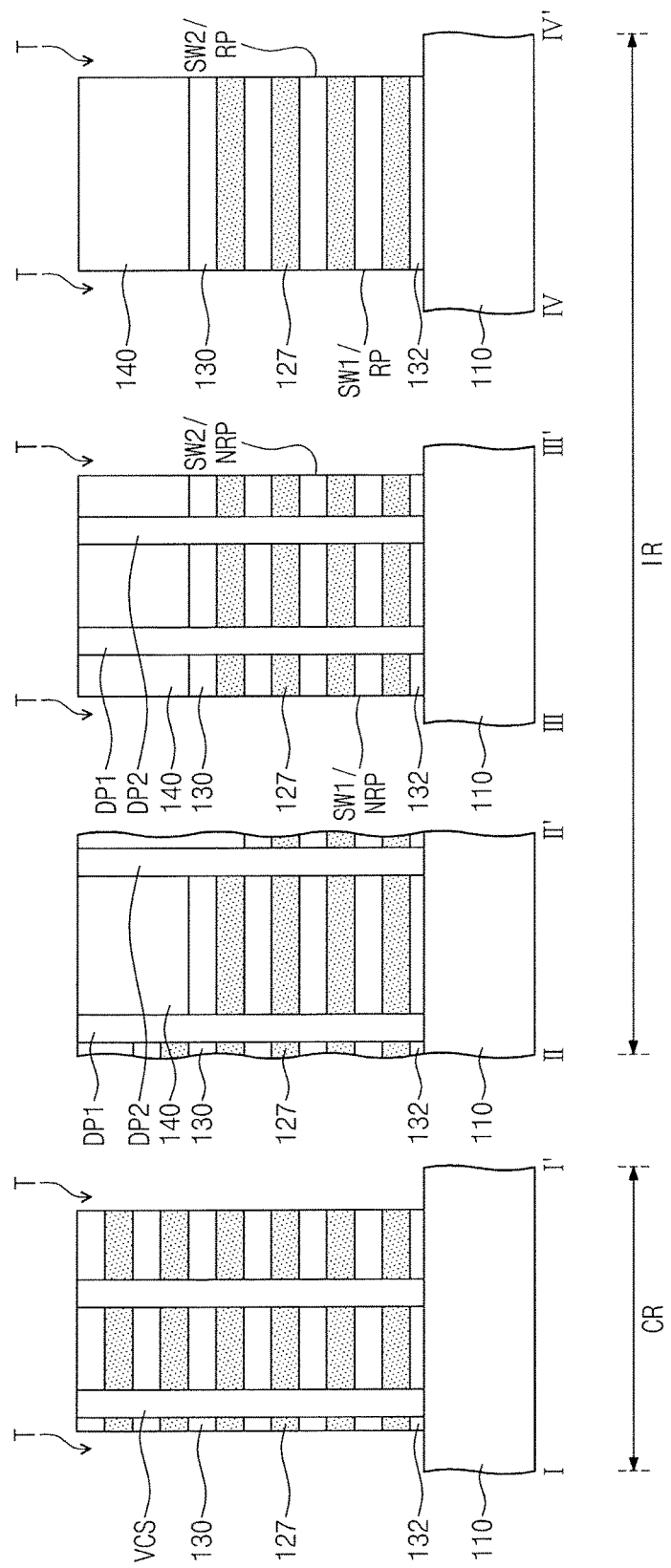

Referring to FIGS. 3, 4, and 7D, the first interlayered insulating layer 140, the insulating layers 135, the sacrificial layers 125, and the buffer dielectric layer 137 may be sequentially patterned to form trenches T exposing the substrate 110. Each of the trenches T may extend from the cell region CR to the connection region IR or in the first direction D1. Thus, preliminary stacks may be defined between the trenches T and each of the preliminary stacks may extend from the cell region CR to the connection region IR or in the first direction D1. Each of the preliminary stacks may include the buffer dielectric pattern 132, which is disposed on the substrate 110, and sacrificial patterns 127 and insulating patterns 130, which are alternatingly stacked on the buffer dielectric pattern 132.

Each of the preliminary stacks may include the staircase structure STS formed in the connection region IR. The staircase structure STS may include the first and second sidewalls SW1 and SW2 extending in the first direction D1. The first and second sidewalls SW1 and SW2 may be disposed on opposite sides of the stacks. The first and second sidewalls SW1 and SW2 of the staircase structure STS may have substantially the same shapes and dimensions as those described with reference to FIGS. 3, 4, 5A, and 5B.

For example, the first sidewall SW1 may include the recessed and non-recessed portions RP and NRP. Each of the recessed portions RP may be a laterally recessed portion with respect to the non-recessed portions NRP. Each of the recessed portions RP may extend in the third direction D3 perpendicular to the substrate 110. Each of the recessed portions RP may be a trench-shaped region that is formed on the first sidewall SW1 to extend in the third direction D3. Each of the recessed portions RP may have a trench shape including a surface that is concavely curved toward an inner region of each stack ST. The recessed and non-recessed portions RP and NRP may be formed in an alternating manner along the first direction D1, and thus, the first sidewall SW1 may have an uneven profile.

In some exemplary embodiments of the present inventive concept, the second sidewall SW2 may include the recessed and non-recessed portions RP and NRP. The recessed and non-recessed portions RP and NRP of the second sidewall SW2 may have substantially the same shapes and dimensions as the recessed and non-recessed portions RP and NRP of the first sidewall SW1.

In some exemplary embodiments of the present inventive concept, each of the staircase sidewalls STSW may connect the non-recessed portions NRP of the first and second sidewalls SW1 and SW2 to each other.

A replacement process may be performed on the preliminary stacks to form the electrode patterns 120 described with reference to FIGS. 3, 4, 5A, and 5B. The replacement process will be described in more detail below with reference to FIGS. 7E and 7F.

Figure 7E:
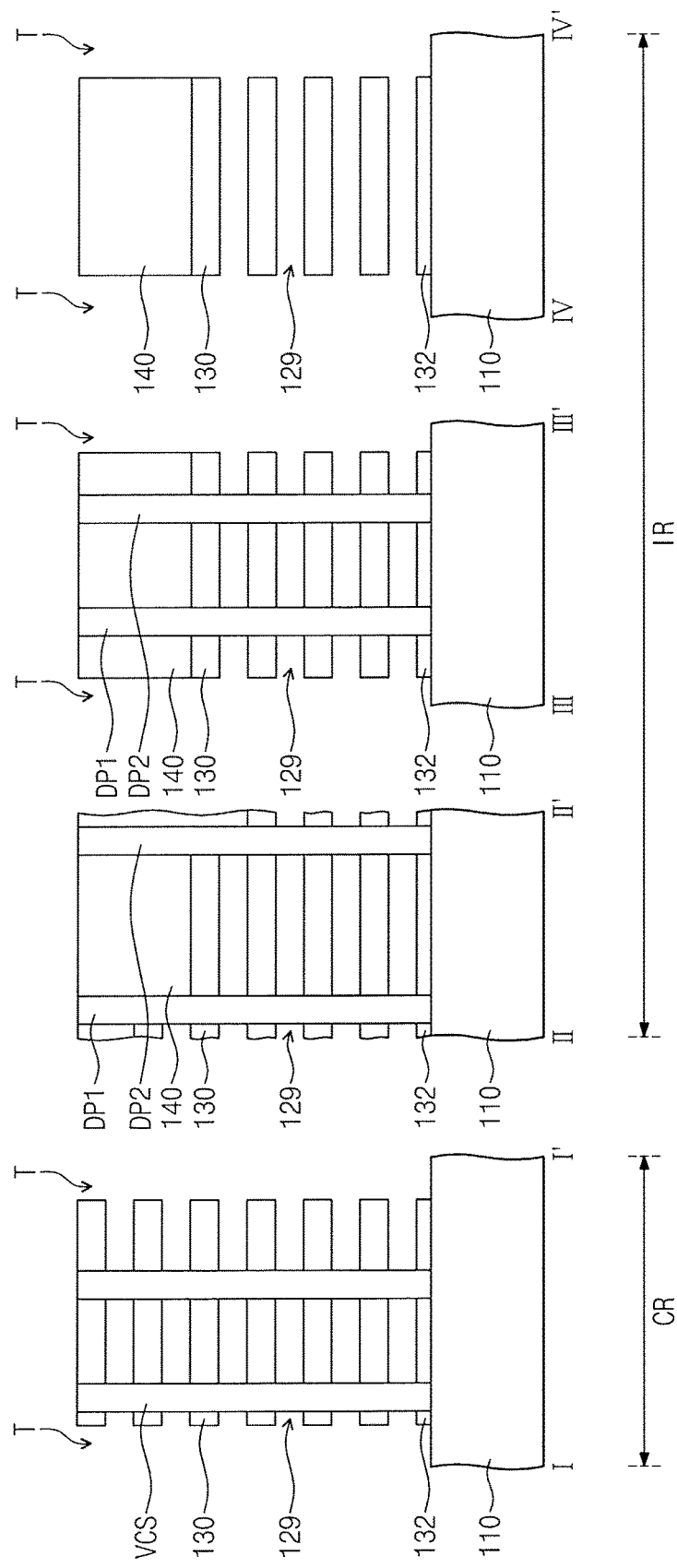

Referring to FIGS. 3 and 7E, the sacrificial patterns 127 exposed by the trenches T may be removed to form gap regions 129 between the insulating patterns 130. The gap regions 129 may be extended from the trenches T in a direction substantially parallel with the top surface of the substrate 110 and may be formed between the insulating patterns 130. The removal of the sacrificial patterns 127 may be performed using an isotropic etching process (e.g., a wet etching process).

When the sacrificial patterns 127 are removed, the dummy pillars DP1 and DP2 may support the insulating patterns 130 in the connection region IR. Thus, damage or movement in the insulating patterns 130, which may occur when the sacrificial patterns 127 are removed, may be reduced or prevented. For example, in the case where the dummy pillars DP1 and DP2 are not provided, vertically adjacent ones of the insulating patterns 130 in the connection region IR may approach each other or may be in contact with each other. In this case, when metal patterns are formed in the gap regions 129 in a subsequent process, at least a portion of the metal patterns may be deformed or might not be formed. According to some exemplary embodiments of the present inventive concept, since the insulating patterns 130 in the connection region IR are supported by the dummy pillars DP1 and DP2, damage or movement in the insulating patterns 130 may be reduced or prevented.

According to some exemplary embodiments of the present inventive concept, at least one of two opposite sidewalls (e.g., the first and second sidewalls SW1 and SW2) of the staircase structure STS may include the recessed portions RP. Thus, an area or volume of the insulating patterns 130, which are supported by the dummy pillars DP1 and DP2, may be reduced during the replacement process. According to some exemplary embodiments of the present inventive concept, when viewed in a plan view, the recessed portion RP may be formed at a position that is relatively far from the dummy pillars DP1 and DP2. For example, in the case where the dummy pillars DP1 and DP2 are overlapped with the boundary between the pad portions 120P in a plan view, the recessed portions RP may be spaced apart from the boundary between the pad portions 120P. The formation of the recessed portions RP may result in partial removal of the insulating patterns 130 at regions that are relatively far from the dummy pillars DP1 and DP2. As a result of the partial removal of the insulating patterns 130, the insulating patterns 130 may be more effectively supported by the dummy pillars DP1 and DP2, during the replacement process.

Thus, according to some exemplary embodiments of the present inventive concept, damage or movement in the insulating patterns 130 when the sacrificial patterns 127 are removed may be reduced or eliminated.

The insulating patterns 130 in the cell region CR may be supported by the vertical channel structures VCS, when the sacrificial patterns 127 are removed.

Figure 7F:
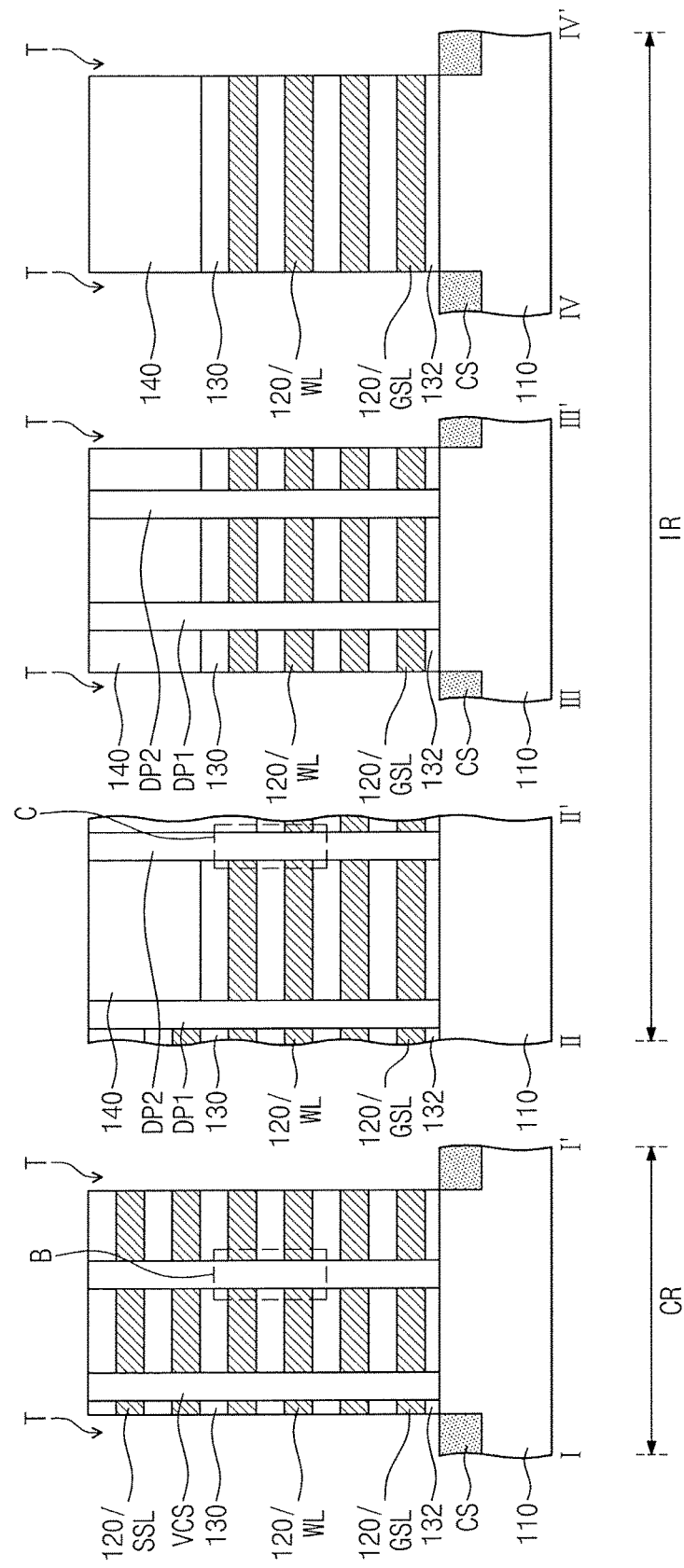

Referring to FIGS. 3 and 7F, a first conductive layer may be formed on the substrate 110 to fill the trenches T and the gap regions 129. The first conductive layer may include a barrier layer, which is formed to conformally cover inner surfaces of the trenches T and the gap regions 129, and an electrode layer, which is formed to fill the remaining spaces of the trenches T and the gap regions 129 in the barrier layer. The first conductive layer may be removed from the trenches T, and as a result, the electrode patterns 120 may be formed in the gap regions 129, respectively. The lowermost one (e.g., GSL) of the electrode patterns 120 may serve as the ground selection line. The uppermost one (e.g., SSL) of the electrode patterns 120 may serve as the string selection line. Others (e.g., WL) of the electrode patterns 120 disposed between the ground and string selection lines GSL and SSL may serve as the word lines. Thus, the stacks ST described with reference to FIGS. 3, 4, 5A, and 5B may be formed.

In the case where the vertical channel structures VCS and the dummy pillars DP1 and DP2 are formed to have the structure described with reference to FIG. 6B, the blocking insulating layer BBL may be formed to conformally cover the gap regions 129, before the formation of the first conductive layer. In the case where the vertical channel structures VCS and the dummy pillars DP1 and DP2 are formed to have the structure described with reference to FIG. 6C, the charge storing layer CL and the blocking insulating layer BBL may be sequentially formed to conformally cover the gap regions 129, before the formation of the first conductive layer. In the case where the vertical channel structures VCS and the dummy pillars DP1 and DP2 are formed to have the structure described with reference to FIG. 6D, the tunnel insulating layer TL, the charge storing layer CL, and the blocking insulating layer BBL may be sequentially formed to conformally cover the gap regions 129, before the formation of the first conductive layer.

The common source regions CS may be formed by injecting dopants into the substrate 110 exposed by the trenches T. In some exemplary embodiments of the present inventive concept, the common source regions CS may be formed after the formation of the electrode patterns 120. In some exemplary embodiments of the present inventive concept, the common source regions CS may be formed before the removal of the sacrificial patterns 127 and after the formation of the trenches T.

Figure 7G:
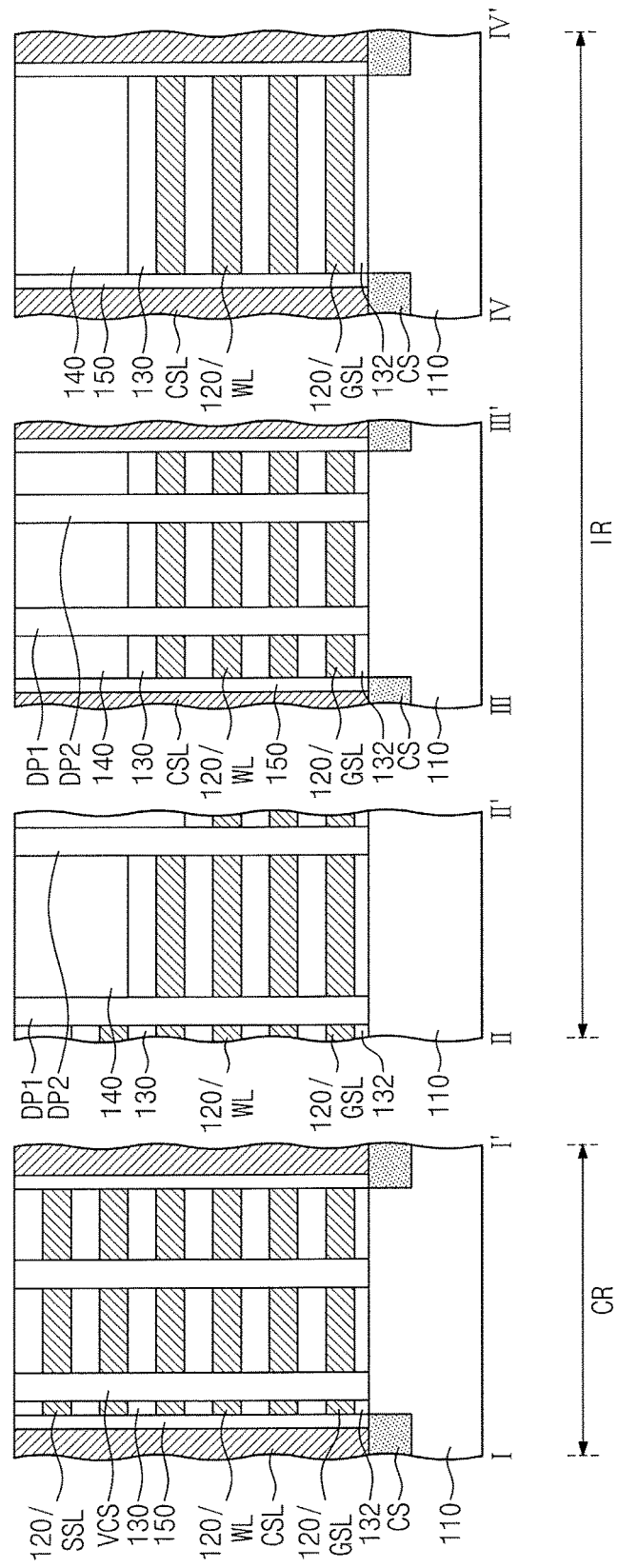

Referring to FIGS. 3 and 7G, the common source lines CSL and the insulating spacers 150 may be formed in the trenches T. In some exemplary embodiments of the present inventive concept, the common source lines CSL may be electrically connected to the common source regions CS, and the insulating spacers 150 may be formed to electrically isolate the common source lines CSL from the electrode patterns 120. The formation of the insulating spacers 150 may include forming an insulating spacer layer to conformally cover exposed surfaces of the common source regions CS and the trenches T and anisotropically etching the insulating spacer layer. The anisotropic etching of the insulating spacer layer may be performed to expose the common source regions CS. A second conductive layer may be formed to fill the trenches T including the insulating spacers 150. The second conductive layer may be planarized to form the common source lines CSL in the trenches T, respectively.

Figure 7H:
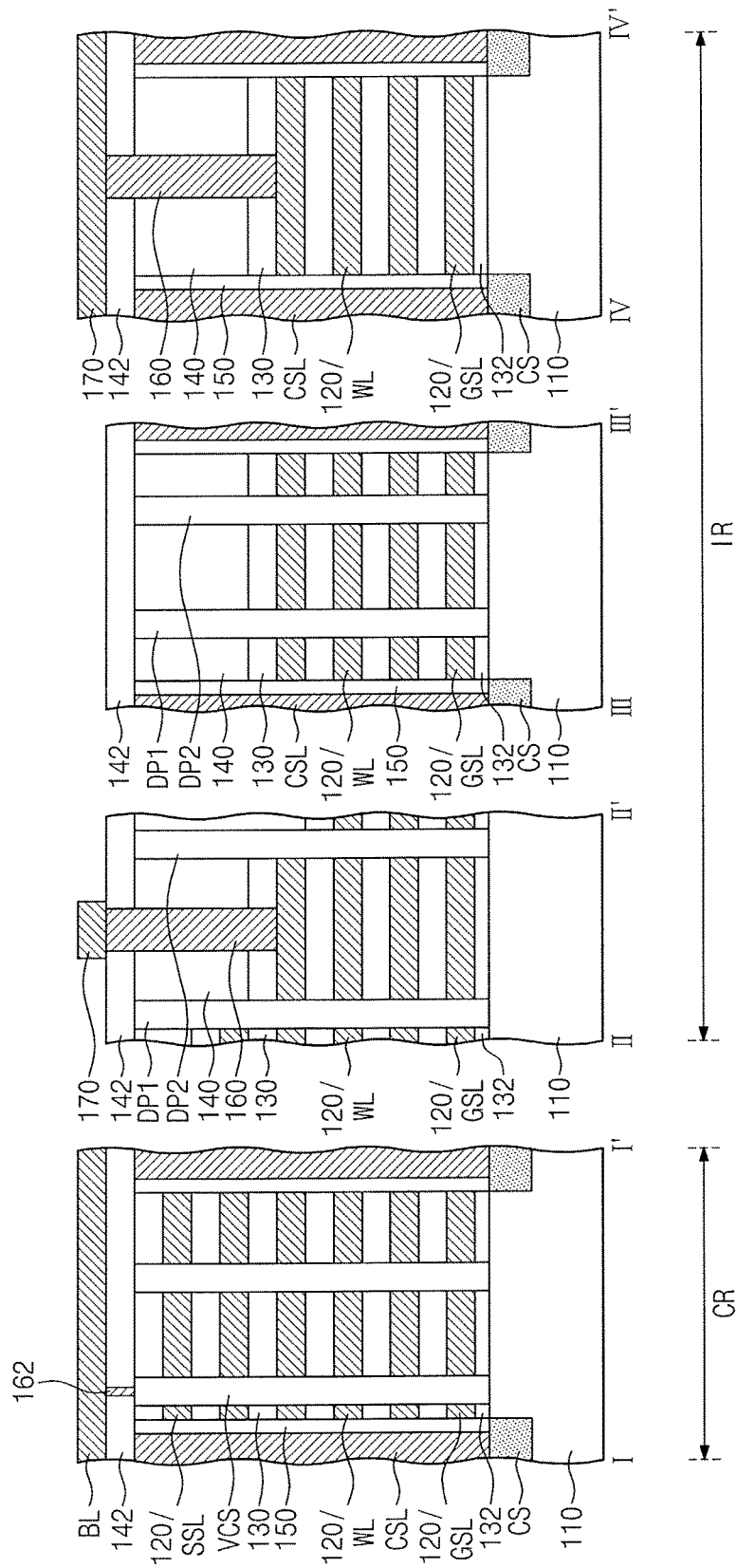

Referring to FIGS. 3 and 7H, the second interlayered insulating layer 142 may be formed on the substrate 110 including the common source lines CSL. The second interlayered insulating layer 142 may be formed to cover the stacks ST, top surfaces of the insulating spacers 150, and top surfaces of the common source lines CSL.

The contact plugs 160, which are respectively connected to the electrode patterns 120, may be formed in the connection region IR. Each of the electrode patterns 120 may include the pad portion 120P, which is not covered by another of the electrode patterns 120. Each of the contact plugs 160 may be connected to a corresponding one of the pad portions 120P. Each of the contact plugs 160 may pass through the insulating pattern 130, the first interlayered insulating layer 140, and the second interlayered insulating layer 142 that are disposed on the pad portion 120P. The bit line contact plugs 162 may be formed to be connected to the vertical channel structures VCS, respectively. The contact plugs 160 and the bit line contact plugs 162 may be formed of or may include a conductive material and may be formed substantially at the same time using the same process.

The bit lines BL may be formed on the second interlayered insulating layer 142 in the cell region CR, and the first interconnection lines 170 may be formed on the second interlayered insulating layer 142 in the connection region IR. The bit lines BL may be connected to the bit line contact plugs 162.

The first interconnection lines 170 may be formed to connect the contact plugs 160, which are connected to the ground selection line GSL and the word lines WL, to each other. The bit lines BL and the first interconnection lines 170 162 may be formed of or may include a conductive material and may be formed substantially at the same time using the same process.

Referring back to FIGS. 3, 4, 5A, and 5B, the third interlayered insulating layer 144 may be formed on the second interlayered insulating layer 142, the bit lines BL, and the first interconnection lines 170. The second interconnection lines 172 may be formed on the third interlayered insulating layer 144. Each of the second interconnection lines 172 may be electrically connected to the contact plug 160 coupled to the string selection line SSL. The contact plug 160 coupled to the string selection line SSL may be electrically connected to a corresponding one of the second interconnection lines 172 through the interconnection line plug 164 penetrating the third interlayered insulating layer 144.

Figure 8:
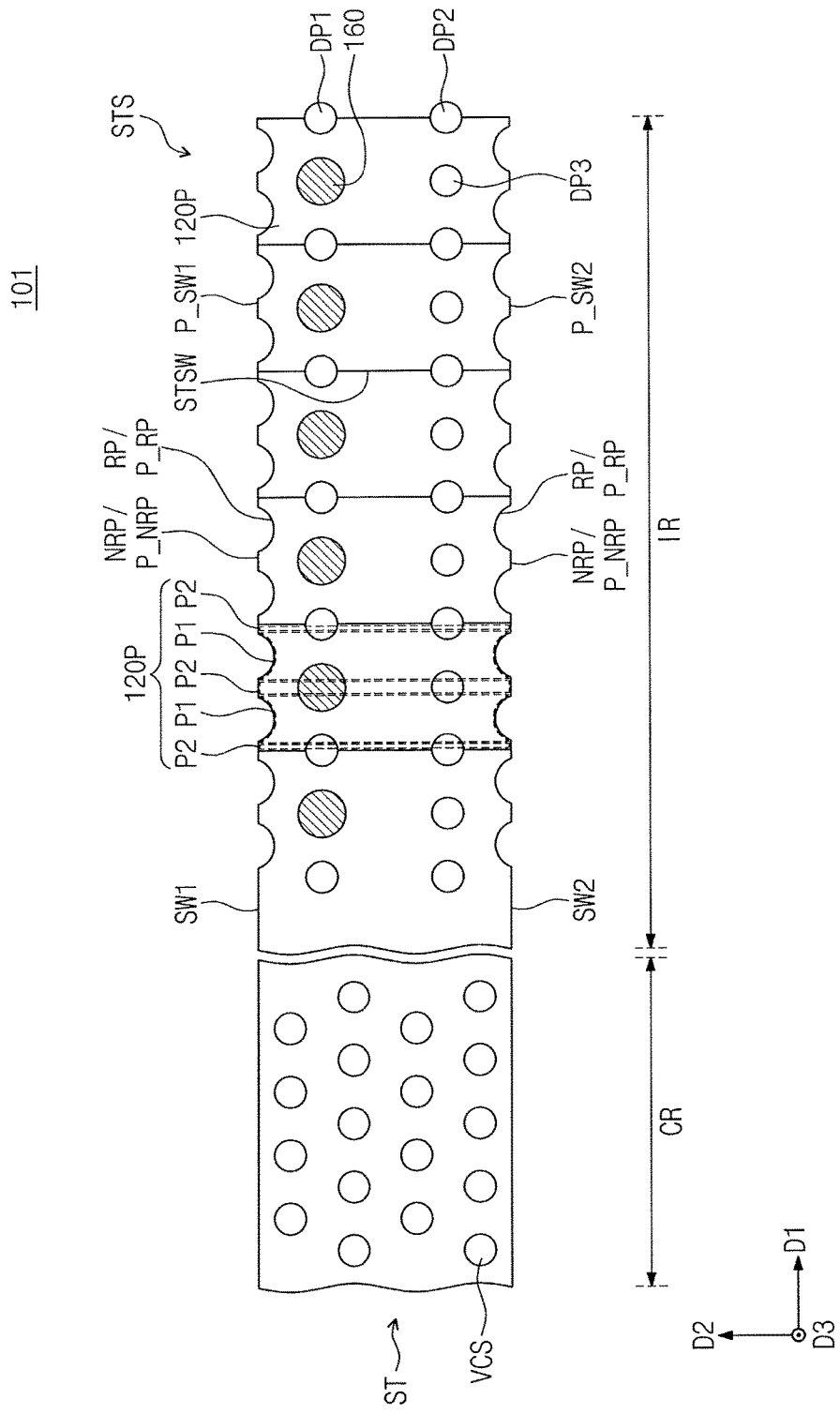
FIG. 8 is a plan view illustrating a semiconductor device according to some exemplary embodiments of the present inventive concept.

FIG. 8 is a plan view illustrating a semiconductor device according to some exemplary embodiments of the present inventive concept. Components previously described with reference to FIGS. 3, 4, 5A, and 5B may be identified by a similar or identical reference number without repeating an overlapping description, and thus duplicative descriptions may be omitted. Third dummy pillars DP3, contact plugs 160, and a pad portion 120P will be described in more detail below.

Referring to FIG. 8, a semiconductor device 101 may include the third dummy pillars DP3. Each of the third dummy pillars DP3 may penetrate the pad portions 120P. When viewed in a plan view, each of the third dummy pillars DP3 may be disposed between an adjacent pair of the second dummy pillars DP2. For example, the second and third dummy pillars DP2 and DP3 may form a row parallel to the first direction D1, and the second and third dummy pillars DP2 and DP3 may be alternatingly arranged in each row.

The contact plugs 160 may be disposed in the connection region IR of the substrate 110. The contact plugs 160 may be connected to the pad portions 120P of the electrode patterns 120, respectively. In some exemplary embodiments of the present inventive concept, when viewed in a plan view, each of the contact plugs 160 may be disposed between an adjacent pair of the first dummy pillars DP1. For example, the contact plugs 160 and the first dummy pillars DP1 may form a row parallel to the first direction D1, and the contact plugs 160 and the first dummy pillars DP1 may be alternatingly arranged in each row.

Each of the electrode patterns may include the pad portion 120P that is not covered by another of the electrode patterns.

The pad portion 120P may include the first pad sidewall P_SW1 and the second pad sidewall P_SW2 extending substantially parallel to the first direction D1. The first and second pad sidewalls P_SW1 and P_SW2 may be disposed on opposite sides of the stack ST from each other. The first pad sidewall P_SW1 may be a part of the first sidewall SW1 of the staircase structure STS, and the second pad sidewall P_SW2 may be a part of the second sidewall SW2 of the staircase structure STS.

In each of the pad portions 120P, the first pad sidewall P_SW1 may include two pad recessed portions P_RP. Each of the pad recessed portions P_RP of the first pad sidewall P_SW1 may be a part of each of the recessed portions RP of the first sidewall SW1. The first pad sidewall P_SW1 may include three pad non-recessed portions P_NRP. Each of the pad non-recessed portions PNRP of the first pad sidewall P_SW1 may be a part of each of the non-recessed portions NRP of the first sidewall SW1.

In some exemplary embodiments of the present inventive concept, the pad portion 120P may include two first portions P1 and three second portions P2. Each of the first portions P1 may be a portion extending from the pad recessed portion P_RP of the first pad sidewall P_SW1 to the second pad sidewall P_SW2 in the second direction D2, and each of the second portions P2 may be a part extending from the pad non-recessed portion P_NRP of the first pad sidewall P_SW1 to the second pad sidewall P_SW2 in the second direction D2. The first and second portions P1 and P2 may be disposed in an alternating manner along the first direction D1. For example, two of the second portions P2 may be adjacent to respective ones of the boundaries between the pad portions 120P, and the other of the second portions P2 may be disposed between the first portions P1. Thus, when viewed in a plan view, the first portions P1 may be spaced apart from the boundaries between the pad portions 120P. Thus, the pad recessed portions P_RP and the recessed portions RP may be spaced apart from the boundary between the pad portions 120P.

Similar to the first pad sidewall P_SW1, the second pad sidewall P_SW2 may include the pad recessed portions P_RP and the pad non-recessed portions P_NRP, which are recessed in the second direction D2. The pad recessed portions P_RP and the pad non-recessed portions P NRP of the second pad sidewall P_SW2 may have substantially the same shapes and dimensions as the pad recessed portions P_RP and the pad non-recessed portions P_NRP of the first pad sidewall P_SW1.

Figure 9:
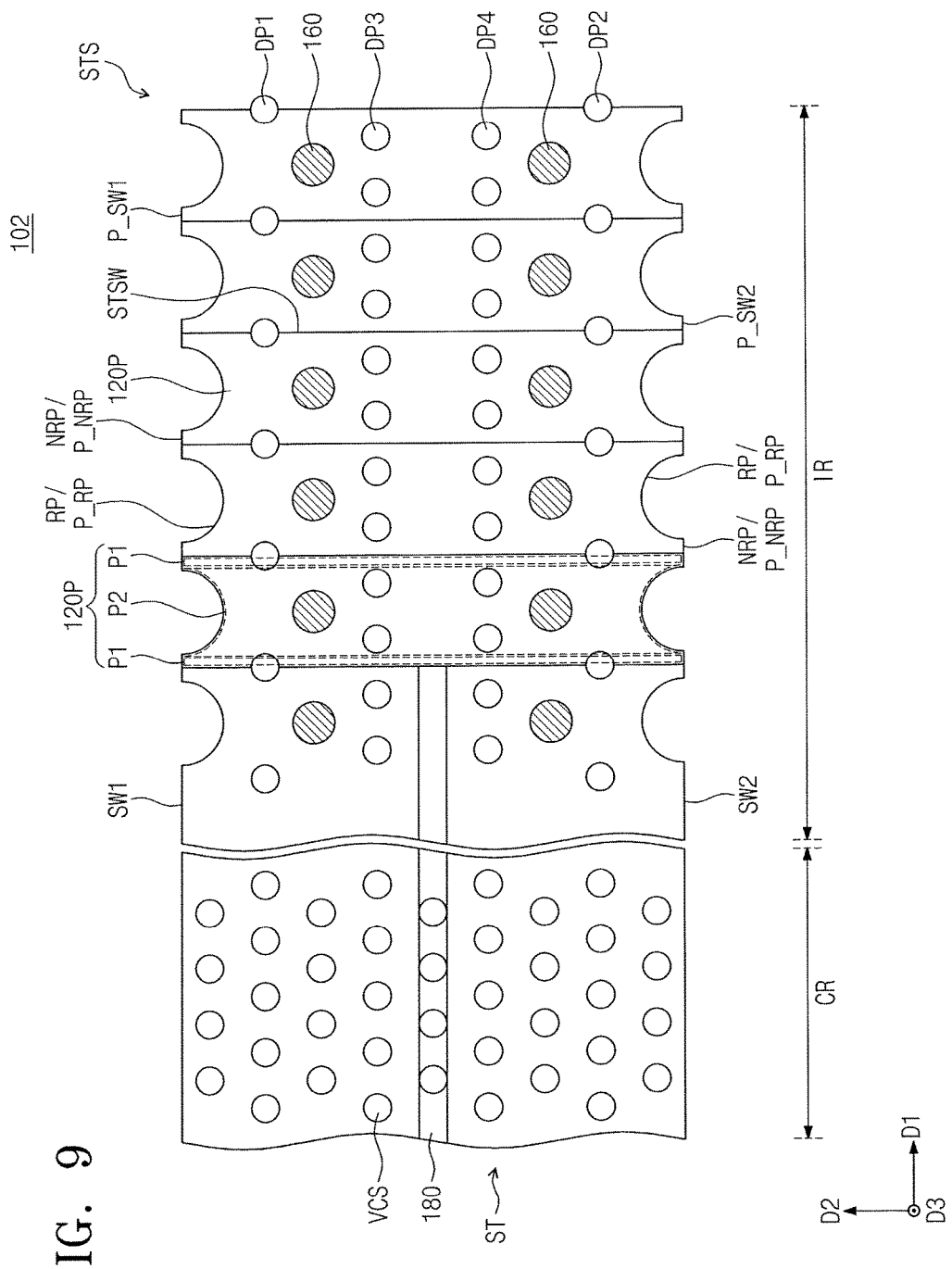
FIG. 9 is a plan view illustrating a semiconductor device according to some exemplary embodiments of the present inventive concept.

FIG. 9 is a plan view illustrating a semiconductor device according to some exemplary embodiments of the present inventive concept. Components previously described with reference to FIGS. 3, 4, 5A, and 5B may be identified by a similar or identical reference number without repeating an overlapping description, and thus duplicative descriptions may be omitted. Vertical channel structures VCS, a string selection line (SSL) separation pattern 180, third and fourth dummy pillars DP3 and DP4, and contact plugs 160 will be described in more detail below.

Referring to FIG. 9, when viewed in a plan view, the vertical channel structures VCS penetrating each stack ST may form nine rows substantially parallel to the first direction D1. When viewed in a plan view, the vertical channel structures VCS of two adjacent rows may be disposed to form a zigzag arrangement along the first direction D1. The vertical channel structures VCS may have substantially the same features as those described with reference to FIGS. 6A to 6D. The vertical channel structures VCS in a center one (e.g., fifth row) of the rows may be disconnected from a bit line, thus serving as dummy vertical channel structures. The vertical channel structures VCS in any other row, except for the center row, may be connected to the bit line, thus serving as active vertical channel structures.

Each of the stacks ST may include the SSL separation pattern 180. When viewed in a plan view, the SSL separation pattern 180 may extend in the first direction D1 and may be connected to the vertical channel structures VCS in the center row. The SSL separation pattern 180 may be disposed on each of the stacks ST to separate conductive patterns at the topmost level (e.g., the string selection line) from each other in the second direction D2. Other conductive patterns (e.g., the word lines and the ground selection line) need not be separated from each other by the SSL separation pattern 180.

A semiconductor device 102 may include the third and fourth dummy pillars DP3 and DP4.

The third dummy pillars DP3 may be arranged in the first direction D1. For example, the third dummy pillars DP3 may form one row extending in the first direction D1. The row of the third dummy pillars DP3 may be positioned between a pair of rows of the first and second dummy pillars DP1 and DP2. In some exemplary embodiments of the present inventive concept, two third dummy pillars DP3 may penetrate each of the pad portions 120P; however, exemplary embodiments of the present inventive concept are not limited thereto.

The fourth dummy pillars DP4 may be arranged in the first direction D1. For example, the fourth dummy pillars DP4 may form one row extending in the first direction D1. The row of the fourth dummy pillars DP4 may be positioned between a pair of rows of the third and second dummy pillars DP3 and DP2. Each of the fourth dummy pillars DP4 may be aligned to a corresponding one of the third dummy pillars DP3 in the second direction D2.

In some exemplary embodiments of the present inventive concept, the contact plugs 160 may form two rows parallel to the first direction D1. One of the two rows of the contact plugs 160 may be positioned between a pair of rows of the first and third dummy pillars DP1 and DP3, and the other of the two rows of the contact plugs 160 may be positioned between a pair of rows of the second and fourth dummy pillars DP2 and DP4. In some exemplary embodiments of the present inventive concept, a pair of the contact plugs 160 may be connected to each of the pad portions 120P; however, exemplary embodiments of the present inventive concept are not limited thereto.

Each of the electrode patterns may include the pad portion 120P that is not covered by another of the electrode patterns. The pad portion 120P may be configured to have substantially the same shape and dimensions as that the pad portion 120P described with reference to FIGS. 3, 4, 5A, and 5B.

According to some exemplary embodiments of the present inventive concept, a staircase structure may be formed on a connection region, and at least one of sidewalls of the staircase structure may have recessed portions. Thus, an area or volume of insulating patterns may be reduced. The insulating layers may be supported by dummy pillars during a replacement process.

When viewed in a plan view, the recessed portions may be formed at a position that is relatively far from the dummy pillars. For example, in the case where the dummy pillars are formed to be overlapped with a boundary between pad portions in a plan view, the recessed portions may be spaced apart from the boundary between the pad portions. The formation of the recessed portions may result in partial removal of the insulating patterns at regions that are relatively far from the dummy pillars. Thus, the insulating patterns may be more effectively supported by the dummy pillars, during the replacement process. Thus, an occurrence of collapsing of the insulating patterns during the replacement process may be reduced or eliminated.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A semiconductor device, comprising:
    a substrate comprising a cell region and a connection region;
    a stack disposed on the substrate;
    a vertical channel structure penetrating the stack in the cell region,
    wherein the stack comprises electrode patterns and insulating patterns, wherein the electrode patterns and the insulating patterns are alternatingly and repeatedly stacked on the substrate,
    wherein each of the electrode patterns extends in a first direction and comprises a pad portion, and wherein the pad portion is positioned in the connection region and is exposed by another of the electrode patterns thereon,
    wherein the pad portion comprises a first sidewall and a second sidewall that extend in the first direction on opposite sides of the pad portion, and
    wherein the first sidewall has a recessed portion that is recessed in a second direction crossing the first direction toward the second sidewall;
    a first portion extending from the recessed portion to the second sidewall in the second direction; and
    a second portion extending from a portion of the first sidewall adjacent to the recessed portion to the second sidewall in the second direction,
    wherein a width of the first portion along the second direction is smaller than that of the second portion.

2. The device of claim 1, further comprising dummy pillars penetrating the stack in the connection region,
    wherein each of the dummy pillars penetrates the second portion of the pad portion.

3. The device of claim 1, wherein the second sidewall has an additional recessed portion that is recessed in the second direction toward the first sidewall.

4. The device of claim 3, wherein the additional recessed portion is included in the first portion.

5. The device of claim 1, wherein the recessed portion is formed in a sidewall of the stack, and wherein the recessed portion extends along a direction perpendicular to the substrate.

6. The device of claim 5, wherein the recessed portion is a concavely recessed trench-shaped region.

7. The device of claim 1, further comprising dummy pillars penetrating the stack in the connection region,
    wherein, when viewed in a plan view, the dummy pillars are overlapped with a boundary between adjacent pad portions.

8. The device of claim 7, wherein, when viewed in the plan view, the recessed portion is spaced apart from the boundary between the adjacent pad portions.

9. A semiconductor device, comprising:
    a substrate comprising a cell region and a connection region;
    a stack disposed on the substrate and extending in a first direction; and
    a vertical channel structure penetrating the stack in the cell region,
    wherein the stack comprises electrode patterns and insulating patterns, wherein the electrode patterns and the insulating patterns are alternatingly and repeatedly stacked on the substrate,
    wherein the stack has a staircase structure in the connection region,
    wherein the staircase structure comprises a sidewall extending in the first direction,
    wherein the sidewall comprises non-recessed portions and recessed portions,
    wherein the recessed portions are laterally recessed toward the stack,
    wherein each of the recessed portions extends in a direction perpendicular to the first direction, and
    wherein each of the recessed portions is a concavely recessed trench-shaped region.

10. The device of claim 9, wherein the non-recessed portions and the recessed portions are alternatingly arranged in the first direction.

11. The device of claim 9, wherein the staircase structure includes a plurality of staircase sidewalls, each of which extends in a second direction crossing the first direction, and wherein heights of the staircase sidewalls decrease along the first direction, and
    wherein the staircase sidewalls are connected to the non-recessed portions of the sidewall.

12. The device of claim 11, further comprising dummy pillars penetrating the stack in the connection region,
    wherein, when viewed in a plan view, the dummy pillars are overlapped with the staircase sidewalls.

13. The device of claim 12, wherein, when viewed in the plan view, a first minimum of distances from each of the dummy pillars to the recessed portions is greater than or equal to a second minimum of distances from each of the dummy pillars to the non-recessed portions.

14. A semiconductor device, comprising:
    a substrate comprising a cell region and a connection region;
    a stack vertically extending from the substrate, wherein the stack comprises a plurality of electrode patterns and a plurality of insulating patterns alternatingly and repeatedly stacked on the substrate; and
    a plurality of dummy pillars penetrating the plurality of electrode patterns and the plurality of insulating patterns in the connection region,
    wherein each of the plurality of electrode patterns comprises a pad portion in the connection region,
    wherein the pad portion comprises a first portion comprising a non-recessed portion along a sidewall of the pad portion and a second portion comprising a recessed portion along the sidewall of the pad portion,
    wherein the dummy pillars are aligned with the non-recessed portion of the pad portion along a direction perpendicular to the sidewall of the pad portion when the dummy pillars and the pad portion are viewed in a plan view, and wherein the recessed portion is a concavely recessed trench-shaped region.

15. The semiconductor device of claim 14, further comprising a vertical channel structure penetrating the stack in the cell region.

16. The semiconductor device of claim 14, wherein the recessed portion comprises a plurality of recessed portions arranged along the sidewall of the pad portion.

17. The semiconductor device of claim 16, wherein the recessed portions are substantially evenly spaced, and wherein each of the recessed portions are separated from adjacent recessed portions by at least one non-recessed portion.

* * * * *